United States Patent
Qian et al.

(10) Patent No.: US 10,346,554 B2
(45) Date of Patent: Jul. 9, 2019

(54) SYSTEM AND METHOD FOR ISOGEOMETRIC ANALYSIS

(71) Applicant: Wisconsin Alumni Research Foundation, Madison, WI (US)

(72) Inventors: Xiaoping Qian, Madison, WI (US); Songtao Xia, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 709 days.

(21) Appl. No.: 14/658,360

(22) Filed: Mar. 16, 2015

(65) Prior Publication Data
US 2016/0275207 A1 Sep. 22, 2016

(51) Int. Cl.
*G06F 17/10* (2006.01)
*G06F 17/50* (2006.01)

(52) U.S. Cl.
CPC .............. *G06F 17/50* (2013.01); *G06F 17/10* (2013.01)

(58) Field of Classification Search
CPC .................................. G06F 17/50; G06F 17/10
USPC ............................................................ 703/1
See application file for complete search history.

(56) References Cited

U.S. PATENT DOCUMENTS

2009/0024370 A1\* 1/2009 Scott ................... G06F 17/5018 703/2

OTHER PUBLICATIONS

Chuang et al. "A novel approach for computing C2-continuous offset of NURBS curves" Int J Adv Manuf Technol (2006) 29: 151-158, © Springer-Verlag London Limited 2006.\*

Aigner, et al., Swept volume parameterization for isogeometric analysis. In: Mathematics of surfaces XIII. 2009. p. 19-44.

Alfeld, et al., The dimension of bivariate spline spaces of smoothness for degree d ≥ 4r + 1. Constructive Approximation 1987;3(1):189-97.

Alfeld, Bivariate spline spaces and minimal determining sets. Journal of Computational and Applied Mathematics 2000;119(1):13-27.

Awanou, et al., Trivariate spline approximations of 3D Navier—Stokes equations. Mathematics of Computation 2005;74(250):585-602.

Bazilevs, et al., Cottrell JA, Evans JA, Hughes TJR, Lipton S, Scott MA, Sederberg TW. Isogeometric analysis using T-splines. Computer Methods in Applied Mechanics and Engineering 2010;199(5):229-63.

Bazilevs, et al., Large eddy simulation of turbulent Taylor—Couette flow using isogeometric analysis and the residual-based variational multiscale method, Journal of Computational Physics 229 (9) (2010) 3402-3414.

Bazilevs, et al., Isogeometric analysis: approximation, stability and error estimates for h-retined meshes, Mathematical Models and Methods in Applied Sciences 16 (07) (2006) 1031-1090.

(Continued)

*Primary Examiner* — Saif A Alhija
(74) *Attorney, Agent, or Firm* — Quarles & Brady LLP

(57) ABSTRACT

A system and method for carrying out an isogeometric analysis process includes accessing the CAD model of the object from the memory. The process also includes analyzing the CAD model to generate a pre-refinement geometric map of the CAD object that has a smoothness projected to maintain a consistency of a geometric map based on the pre-refinement geometric map during a refinement of the mesh. The process further includes refining the mesh based on the pre-refinement geometric map to converge toward a refinement criteria associated with the CAD model.

19 Claims, 28 Drawing Sheets

(56) References Cited

OTHER PUBLICATIONS

Beirão da Veiga, et al., IsoGeometric analysis using T-splines on two-patch geometries, Computer methods in applied mechanics and engineering 200 (21) (2011) 1787-1803.

Burkhart, et al., Isogeometric finite element analysis based on Catmull—Clark: subdivision solids. In: Computer graphics forum, vol. 29. Wiley Online Library; 2010. p. 1575-84.

Chuang, et al., A novel approach for computing C2-continuous offsett NURBS curves, Int. J. Adv. Manuf. Technol., 2006, 151-158, vol. 29, Springer-Verlag London Limited.

Clough, et al., Finite element stiffness matrices for analysis of plate bending, 1966. (1966) 515-545.

Cohen, et al., A B-spline-like basis for the Powell-Sabin 12-split based on simplex splines, Mathematics of Computation 82 (283) (2013) 1667-1707.

Cottrell, et al., Studies of refinement and continuity in isogeometric structural analysis, Computer methods in applied mechanics and engineering 196 (41) (2007) 4160-4183.

Dierckx, On calculating normalized Powell—Sabin B-splines. Computer Aided Geometric Design 1997;15(1):61-78.

Dörfel, et al., Adaptive isogeometric analysis by local h-refinement with T-splines. Computer Methods in Applied Mechanics and Engineering 2010;199(5):264-75.

Hong, Spaces of bivariate spline functions over triangulation, Approx. Theory Appl 7 (1) (1991) 56-75.

Hughes, et al., Isogeometric analysis: CAD, finite elements, NURBS, exact geometry and mesh refinement, Computer methods in applied mechanics and engineering, 2005,4135-4195, vol. 194.

Jaxon, et al., Isogeometric analysis on triangulations, Computer-Aided Design, 2014, 47-57, vol. 46.

Lai, et al., Bivariate splines for fluid flows. Computers & Fluids 2004; 33(8):1047-73.

Li, et al. Isogeometric analysis and shape optimization via boundary integral. Computer-Aided Design 2011;43 (11)1427-37.

Li, et al., On linear independence of T-spline blending functions, Computer Aided Geometric Design 29 (1) (2012) 63-76.

Li, et al., Analysis-suitable T-splines: characterization, refineability, and approximation, Mathematical Models and Methods in Applied Sciences 24 (06) (2014) 1141-1164.

Lyness, et al., A survey of numerical cubature over triangles, in: Proceedings of Symposia in Applied Mathematics, vol. 48, 1994, pp. 127-150.

Martin et al., Volumetric parameterization and trivariate B-spline fitting using harmonic functions. Computer Aided Geometric Design 2009;26(6):648-64.

Percell, On cubic and quartic Clough—Tocher finite elements. SIAM Journal on Numerical Analysis 1976;13(1):100-3.

Powell, et al., Piecewise quadratic approximations on triangles. ACM Transactions on Mathematical Software (TOMS) 1977;3(4):316-25.

Qian, et al., Isogeometric shape optimization of photonic crystals via Coons patches. Computer Methods in Applied Mechanics and Engineering 2011;200:2237-55.

Qian, Full analytical sensitivities in NURBS based isogeometric shape optimization, Computer Methods in Applied Mechanics and Engineering 199 (29) (2010) 2059-2071.

Rivara, New mathematical tools and techniques for the refinement and/or improvement of unstructured triangulations, in: Proc. 5th Int. Meshing Roundtable, vol. 96, Citeseer, 1996, pp. 77-86.

Scott, et al., Local refinement of analysis-suitable T-splines. Computer Methods in Applied Mechanics and Engineering 2012;213:206-22.

Scott, et al., Isogeometric boundary element analysis using unstructured T-splines. Computer Methods in Applied Mechanics and Engineering 2013;254: 197-221.

Scott, T-splines as a Design-Through-Analysis technology, Ph.D. Thesis, The University of Texas at Austin.

Sederberg, et al., T-splines and T-NURCCs, in: ACM Transactions on Graphics (TOG), vol. 22, ACM, 2003, pp. 477-484.

Sederberg, et al., T-spline simplification and local refinement, in: ACM Transactions on Graphics (TOG), vol. 23, ACM, 2004, pp. 276-283.

Speleers, et al. Isogeometric analysis with Powell-Sabin splines for advection-diffusion-reaction problems. Computer Methods in Applied Mechanics and Engineering 2012; 221-222:132-148.

Speleers, et al. From NURBS to NURPS geometries. Computer Methods in Applied Mechanics and Engineering 2012; 255:238-54.

Speleers, A normalized basis for quintic Powell-Sabin splines. Computer Aided Geometric Design 2010; 27(6):438-57.

Speleers, A normalized basis for reduced Clough—Tocher splines. Computer Aided Geometric Design 2009; 27 (9):700-12.

Speleers, Construction of normalized B-splines for a family of smooth spline spaces over Powell-Sabin triangulations. Constructive Approximation 2011; 37(1):41-72.

Speleers, et al. Numerical solution of partial differential equations with Powell-Sabin splines, Journal of computational and applied mathematics 189 (1) (2006) 643-659.

Thomas, et al., Bézier projection: a unified approach for local projection and quadrature-free refinement and coarsening of NURBS and T-splines with particular application to isogeometric design and analysis, 2014; arXiv preprint arXiv:1404.7155.

Wall, et al., Isogeometric structural shape optimization, Computer methods in applied mechanics and engineering 197 (33) (2008) 2976-2988.

Wang, et al., Trivariate solid T-spline construction from boundary triangulations with arbitrary genus topology. Computer-Aided Design 2012; 45 (2):351-60.

Wang, et al., An improved NURBS-based isogeometric analysis with enhanced treatment of essential boundary conditions, Computer Methods in Applied Mechanics and Engineering 199 (37) (2010) 2425-2436.

Xu, et al., Analysis-suitable volume parameterization of multi-block computational domain in isogeometric applications. Computer-Aided Design 2013; 45 (2):395-404.

Zhang, et al., Solid T-spline construction from boundary representations for genus-zero geometry. Computer Methods in Applied Mechanics and Engineering 2012; 249:185-97.

\* cited by examiner

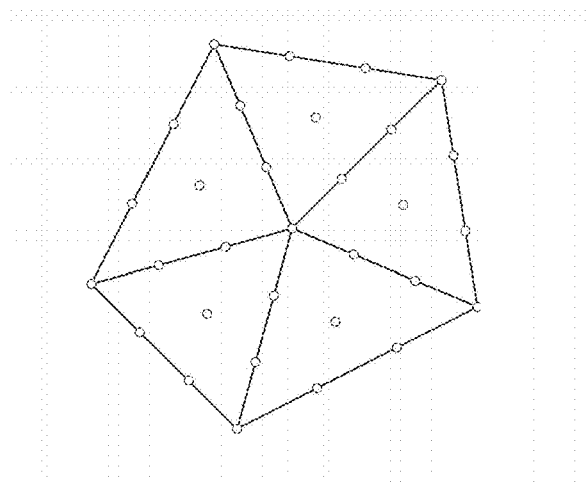 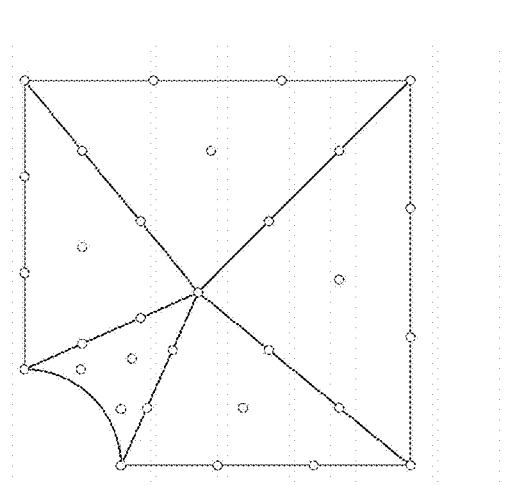
FIG. 20A  FIG. 20B
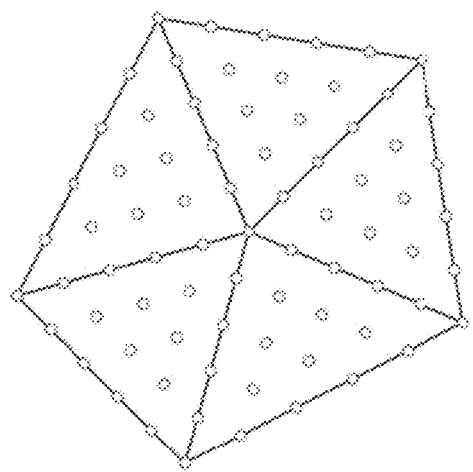 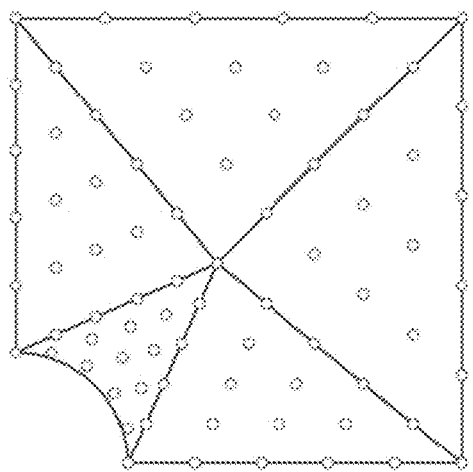
FIG. 20C  FIG. 20D
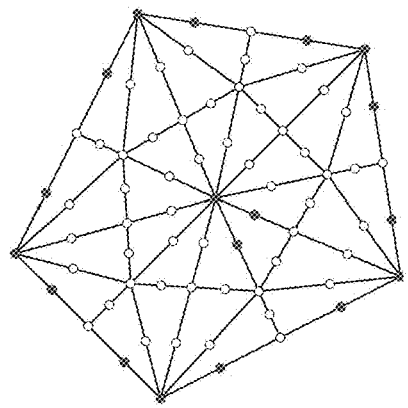 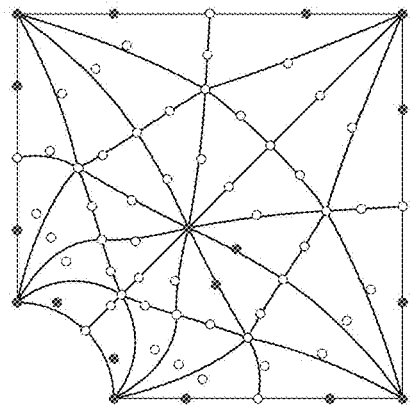
FIG. 20E  FIG. 20F

SYSTEM AND METHOD FOR ISOGEOMETRIC ANALYSIS

STATEMENT REGARDING FEDERALLY SPONSORED RESEARCH

This invention was made with government support under 1435072 awarded by the National Science Foundation. The government has certain rights in this invention.

REFERENCE TO RELATED APPLICATION

N/A.

BACKGROUND OF THE INVENTION

The present disclosure relates, generally, to computer aided design systems and methods.

Finite element analysis (FEA) is a computational tool commonly used by engineers in designing parts and systems using computer aided design (CAD) software. FEA allows testing of mechanical properties of a computer designed part so that the part can be modified if it doesn't meet the required mechanical specifications. One of the limitations of FEA is that it requires use of an approximated version of the computer-modeled part. The approximated geometry tends to be blockier than the actual design, but this is required in order for conventional FEA to break the part into tiny elements, which are each analyzed. Curved surfaces do not easily break up into the types of elements needed for modern FEA. As a result the results are approximations of the performance of the actual part, which in some cases are pretty close, but which in other cases can be quite far off. These elements are connected together in the form of a mesh.

Isogeometric analysis is an analysis approach introduced by Hughes et al. in T. Hughes, J. Cottrell, Y. Bazilevs, Isogeometric analysis: CAD, finite elements, NURBS, exact geometry and mesh refinement, Computer methods in applied mechanics and engineering 194 (39) (2005) 4135-4195, which is incorporated herein by reference in its entirety. In isogeometric analysis, the same basis functions used to represent geometric models, such as Non-Uniform Rational B-Splines (NURBS), are also used to approximate field variables in solving partial differential equations (PDEs). Due to the same basis used in geometric representation and in solution approximation, isogeometric analysis eliminates the geometric approximation error commonly occurred in classical FEA procedures. Once an initial mesh is constructed, refinements can also be implemented and an exact geometry is maintained at all levels without the necessity of interaction with the CAD system. Another advantage of isogeometric analysis is its computational efficiency on a per-node basis over classical $C^0$ Lagrange polynomial based finite element. The higher continuity of the NURBS basis has been demonstrated to significantly improve the numerical efficiency and accuracy on a per node basis in many areas including structural analysis, fluid simulation, and shape optimization.

Isogeometric analysis techniques relying on a basis other than NURBS have also been developed. To overcome the limitation of the tensor product structure of NURBS in local mesh refinement, methods based on subdivision solids and T-splines have been developed recently and have been successfully used in isogeometric analysis. The introduction of T-junction in T-splines allows T-splines to represent complex shapes in a single patch and permit local refinement. On the other hand, challenges exist with respect to analysis-suitable T-splines, such as how to obtain efficient local refinement and effective treatment of so-called extraordinary points.

Recently, triangular Bézier splines have emerged as a powerful alternative to shape modeling and isogeometric analysis due to their flexibility in representing shapes of complex topology and their higher order of continuity. Local refinement can also be implemented without any great difficulty. Various sets of basis functions have been defined on triangulations using bivariate spline functions. Some bivariate splines have also been effectively applied in solving PDEs, including some where quadratic Powell-Sabin (PS) splines with $C^1$ smoothness are considered. A locally-supported basis is constructed by normalizing the piecewise quadratic PS B-splines and it is cast in the Bernstein-Bézier form. Such basis has global $C^1$ smoothness and is used to approximate the solution of PDEs. More generalized $C^r$ basis and elements including PS, Clough-Tocher (CT), and polynomial macro-elements based on rational triangular Bézier splines (rTBS) have also been introduced and applied successfully in isogeometric analysis on triangulations.

Referring to FIG. 1, cubic $C^1$ smooth basis functions with CT macro-elements are illustrated within the context of a rTBS based isogeometric analysis. The given physical domain is triangulated into a set of $C^1$ smooth Bézier elements, which are mapped from the parametric mesh. More particularly, free control points and domain points 10 are determined by dependent control points and domain points 12, respectively under the continuity constraints. Thus, the $C^1$ basis functions $\psi$ are constructed as linear combinations of the $C^0$ Bernstein basis $\phi$, under the continuity constraints. The resulting analysis has shown to be efficient, accurate, and convergent. However, optimal convergence in h-refinement has only been achieved for $C^0$ elements and the convergence rate is sub-optimal for $C^r$ elements.

Thus, it would be desirable to have a system and method for creating meshes from models with a controlled amount of and, preferably, without any approximation. Furthermore, it would be desirable that such system and method demonstrate effective and efficient convergence in the analysis.

SUMMARY OF THE INVENTION

In accordance with one aspect of the present disclosure, a system is provided for creating a mesh from a computer aided design model during an isogeometric analysis process. The system includes a memory having access to a computer aided design (CAD) model of an object. The system also includes a processor configured to carry out an isogeometric analysis process. The processor is configured to access the CAD model of the object from the memory. The processor is also configured to analyze the CAD model to generate a pre-refinement geometric map of the CAD object that has a smoothness projected to maintain a consistency of a mesh based on the pre-refinement geometric map during a refinement of the mesh. The processor is further configured to refine the mesh based on the pre-refinement geometric map to converge toward a refinement criteria associated with the CAD model.

In accordance with another aspect of the present invention, a method is provided for creating a mesh from a computer aided design model during an isogeometric analysis process. The method includes accessing to a computer aided design (CAD) model of an object. The method also includes analyzing the CAD model to generate a pre-refinement geometric map to serve as a map between a parametric mesh and a physical mesh of the computer aided design model. To do so, the method includes generating the pre-refinement geometric map to have smoothness projected to maintain consistency of the geometric map between the parametric mesh or the physical mesh during refinement by determining control points that do not need to be relocated during refinement of the parametric mesh or the physical mesh because the control points satisfy a continuity constraint. The method further includes refining the parametric mesh or the physical mesh based on the pre-refinement geometric map to converge toward a refinement criteria associated with the CAD model.

Additional features and advantages of the present invention will be apparent from the following detailed description taken in conjunction with the accompanying drawings.

BRIEF DESCRIPTION OF THE DRAWINGS

FIG. 20A is a graphic illustration of a parametric mesh in $S_3^0(T)$ of the physical domain of FIG. 18.

FIG. 20B is a graphic illustration of a physical mesh in $S_3^0(T)$ of the physical domain of FIG. 18.

FIG. 20C is a graphic illustration of a parametric mesh in $S_5^0(T)$ of the physical domain of FIG. 18.

FIG. 20D is a graphic illustration of a physical mesh in $S_5^0(T)$ of the physical domain of FIG. 18.

FIG. 20E is a graphic illustration of a parametric mesh in $S_2^1(T_{ps})$ with basis obtained by DC with PS macro-elements of the physical domain of FIG. 18.

FIG. 20F is a graphic illustration of a $C^1$ physical mesh obtained by DC with PS macro-elements of the physical domain of FIG. 18.

DETAILED DESCRIPTION OF THE INVENTION

Figure 1:
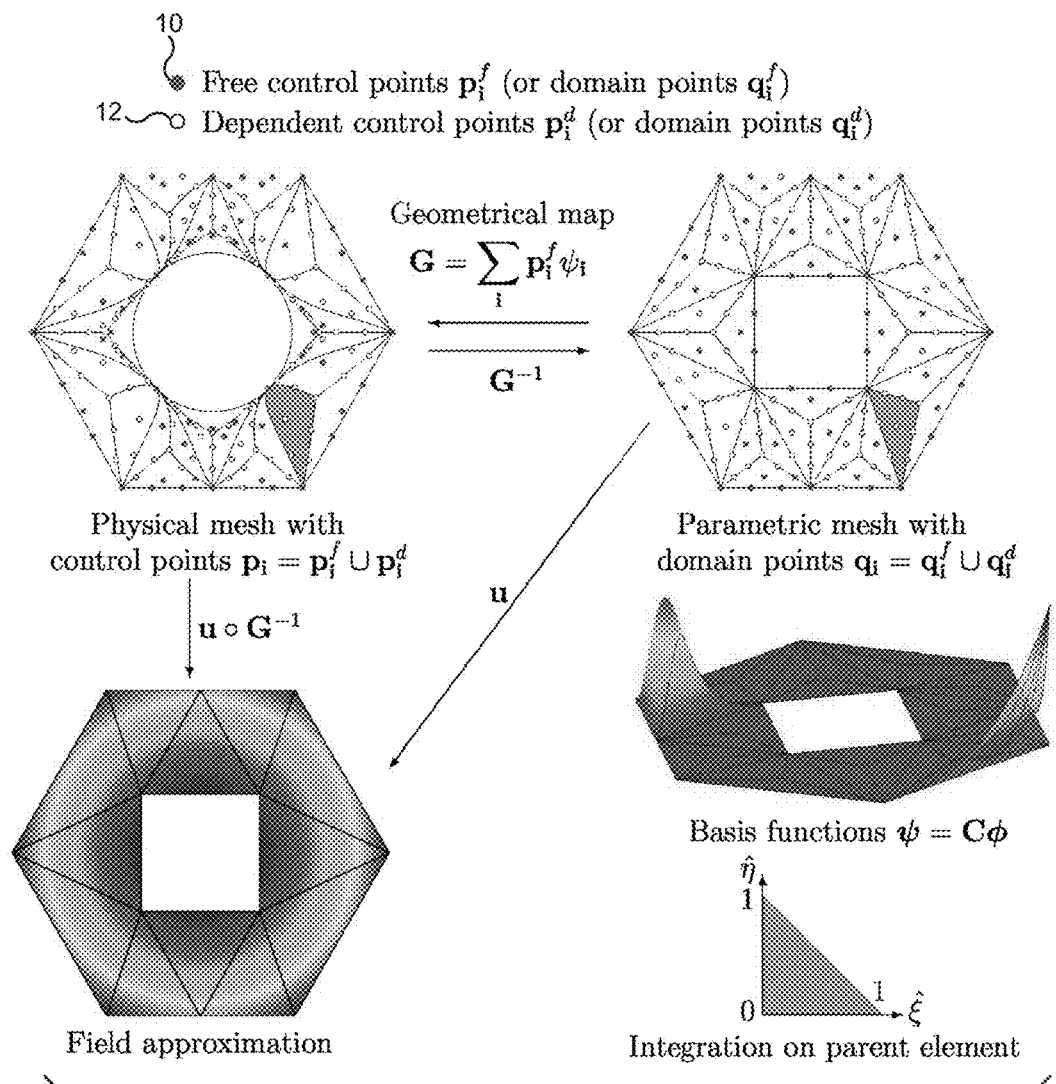
FIG. 1 is a schematic illustration of a rational triangular Bézier splines (rTBS) based isogeometric analysis.

As will be described, the present disclosure provides an approach that can provide convergence for all $C^r$ rTBS elements based isogeometric analysis in the context of h-refinement, even relative to a criteria for optimal convergence. Approximation power and convergence rates are used to evaluate the performance of numerical schemes for solving PDEs. The NURBS space has been proved to have full approximation power and deliver an optimal rate of convergence as the classical finite element spaces. Similar approximation estimates that are optimal with respect to the polynomial degree of the underlying spline space have also been developed for T-splines that are defined on a particular two-patch structure. However, no convergence results have been reported for T-splines defined on more generalized T-meshes that include extraordinary points, which usually require additional continuity constraints on the surrounding control points to achieve $G^1$ continuity.

As will follow, an approach to rTBS based isogeometric analysis is described. An initial coarse parametric mesh is first refined into elements that are sufficiently small for analysis and the global $C^r$ smooth basis is then constructed by imposing continuity constraints on adjacent triangles in the refined parametric mesh. Based on the $C^r$ basis, the $C^r$ geometric map is obtained. Although such a refine-then-smooth approach does lead to $C^r$ stable basis that is sufficient for analysis, the resulting geometric map may not be consistent before and after the $C^r$ constraints are imposed. The inconsistency in geometric maps leads to deteriorated convergence rate.

The present disclosure recognizes that the reason for such inconsistency in geometric map is as follows. The $C^r$ basis is obtained via continuity constraints on domain points in the parametric mesh. With the $C^r$ basis, some domain points are free and other domain points are dependent on these free points. For the geometric map that maps the parametric mesh to the physical mesh, the control points corresponding to the free domain points are chosen as free control points. If the remaining dependent control points do not satisfy the same continuity constraints, they would have to be relocated to satisfy the constraints to ensure the map is $C^r$. Such relocation of dependent control points leads to a change of the geometric map.

To overcome such inconsistency in the geometric map in h-refinement with the refine-then-smooth approach, a three-step approach is provided. As will described, this approach can to achieve convergence in IGA with $C^r$ rTBS elements. In one non-limiting example, this approach can achieve convergence with respect to objective, optimal criteria for convergence. In particular, a pre-refinement geometric map is constructed that possesses sufficient smoothness to maintain the consistency of the geometric map for subsequent refinements. From the pre-refinement smooth geometric map, the mesh is uniformly refined. The macro-element techniques is used to obtain stable $C^r$ smooth basis for analysis. In this "smooth-refine-smooth" approach, the smoothness in the first step is used for geometric reason, so that the resulting geometric map stays consistent during the mesh refinement. The smoothness in the last step provides a stable basis over triangulation for analysis. The provided smooth-refine-smooth approach can, as a non-limiting example, provide optimal convergence in h-refinement for all types of $C^r$ rTBS elements. This approach is also applicable to some supersplines $S_5^{r,\rho}$, $(\rho > r)$, where some vertices or edges in macro-triangles possess higher order $C^\rho$ smoothness than the global $C^r$ smoothness. In such cases, the smoothness of the pre-refinement geometric map should be $C^\rho$.

Bézier Triangles

NURBS has been widely used as a standard to represent curves and surfaces in CAD systems. Each knot span of a NURBS curve corresponds to a Bézier curve that is defined through Bernstein basis functions. A d-th degree Bernstein polynomial is defined as:

$$B_{ij,d}(\xi) = \binom{d}{i,j}\xi^i(1-\xi)^{d-i}, \xi \in [0,1], \quad (1);$$

where $$\binom{d}{i,j} = \frac{d!}{i!j!}, i+j=d.$$

Accordingly a d-th degree bivariate Bernstein polynomial is defined as:

$$B_{i,d}(\xi) = \frac{d!}{i!j!k!}\gamma_1^i\gamma_2^j\gamma_3^k, \quad |i|=i+j+k=d, \quad (2);$$

where i represents a triple index (i,j,k) and $(\gamma_1,\gamma_2,\gamma_3)$ is the barycentric coordinate of a point $\xi \in \mathbb{R}^2$. Every point $\xi=(\xi_1, \xi_2)$ in a fixed triangle with vertices $v_1$, $v_2$, $v_3 \in \mathbb{R}^2$ can be written uniquely in the form:

$$\xi = \gamma_1 v_1 + \gamma_2 v_2 + \gamma_3 v_3, \quad (3);$$

with $\gamma_1+\gamma_2+\gamma_3=1$.

It has been shown that the set $$\{B_{i,d}\}_{|i|=d}$$

is a basis for the space of degree d bivariate polynomials $\mathcal{P}_d$. A triangular Bézier patch can be defined as:

$$b(\xi) = \sum_{|i|=d} p_i B_{i,d}(\xi), \quad (4);$$

where $p_i$ represents a triangular array of control points. A rational Bézier triangle can be defined similarly as:

$$b(\xi) = \sum_{|i|=d} p_i \phi_{i,d}(\xi), \quad (5);$$

with $\phi_{i,d}$ being the rational Bernstein basis:

$$\phi_{i,d} = \frac{w_i B_{i,d}}{\sum_{|i|=d} w_i B_{i,d}} = \frac{w_i B_{i,d}}{w}, \quad (6);$$

where $w_i$ are the weights associated with the control points $p_i$.

Bivariate Bernstein polynomials can be used to define a polynomial function f of degree d over a triangle $\tau=\{v_1, v_2, v_3\}$ as:

$$f(\xi) = \sum_{|i|=d} b_i \phi_{i,d}(\xi), \quad (7)$$

where $\phi_{i,d}$ are the rational Bernstein basis polynomials associated with $\tau$. The $b_i$ are called the Bézier ordinates of f and their associated set of domain points is defined as:

$$D_{d,T} = \left\{ q_{ijk} = \frac{iv_1 + jv_2 + kv_3}{d}, i+j+l=d \right\}. \quad (8)$$

Figure 2A:
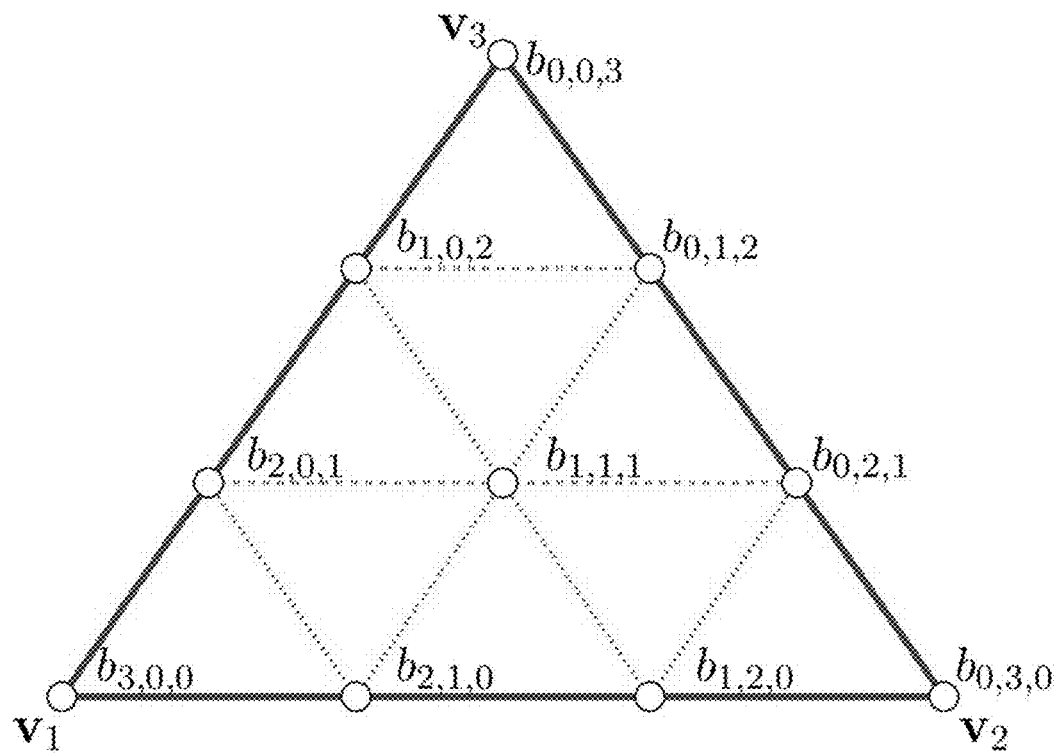
FIG. 2A is a schematic illustration of domain points of the Bézier ordinates $b_{ijk}$ in $\{v_1, v_2, v_3\}$.
Figure 2B:
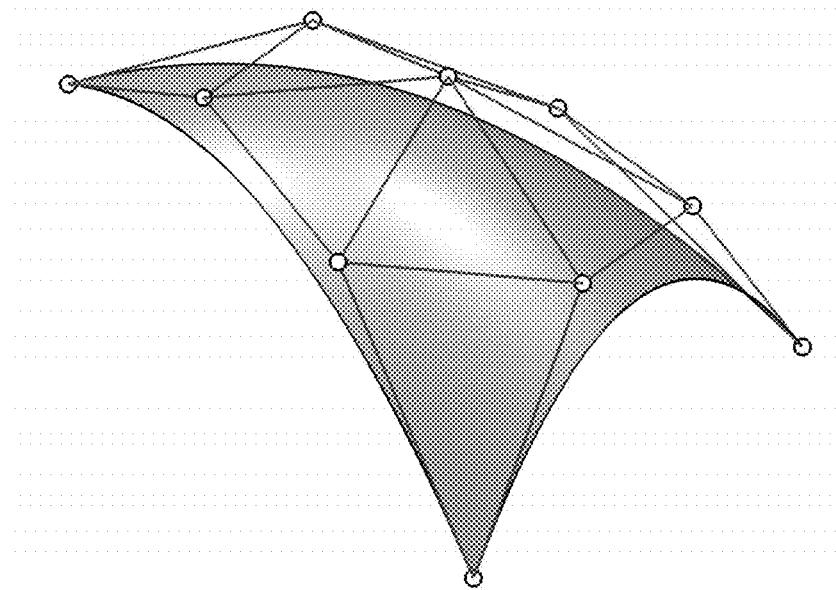
FIG. 2B is a graphic illustration of triangular Bézier patch $b(\xi)$.
Figure 3A:
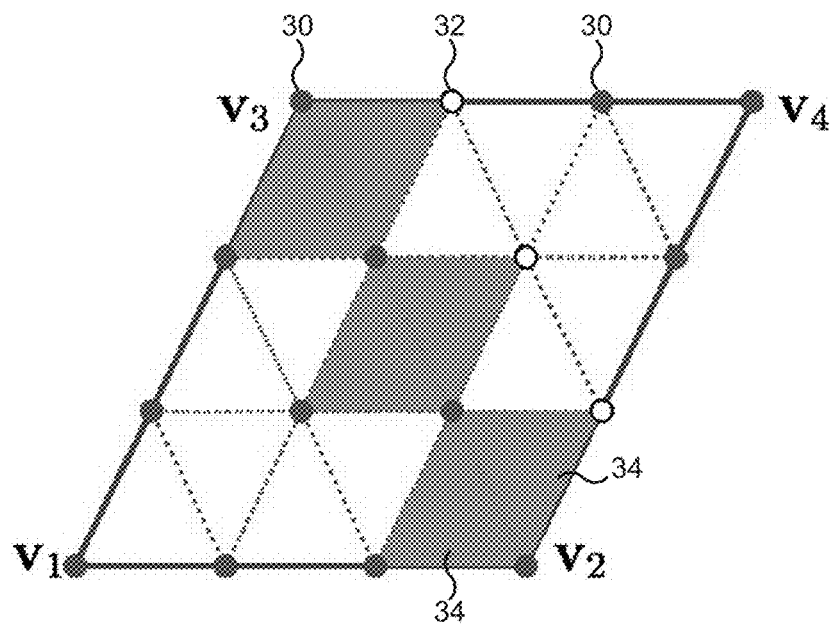
FIG. 3A is a graphic illustration of triangular Bézier patches with $C^1$ continuity constraints, specifically, two domain triangles with $C^1$ constraints on Bézier ordinates.
Figure 3B:
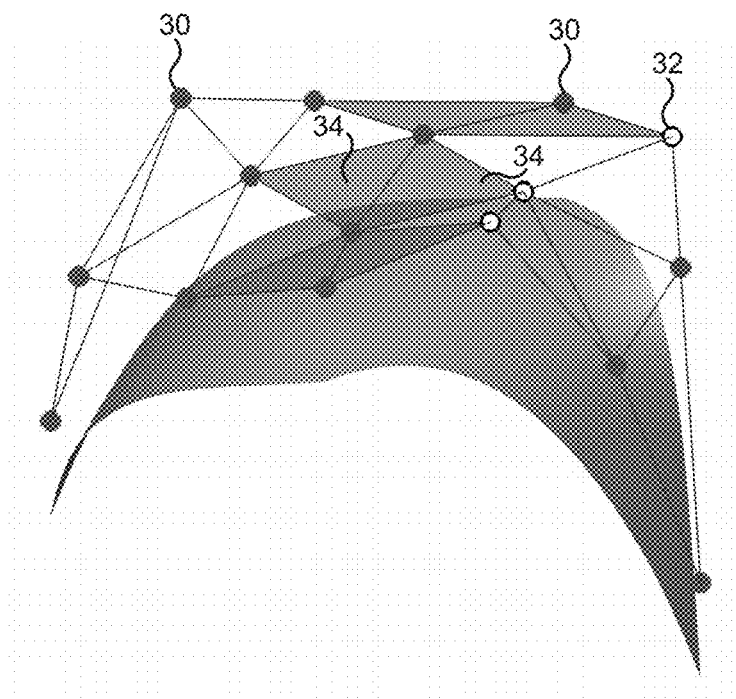
FIG. 3B is a graphic illustration of triangular Bézier patches with $C^1$ continuity constraints, specifically, two Bézier patches with $C^1$ continuity.

For example, FIGS. 2A and 2B illustrate an example of the associated domain points of the Bézier ordinates (2A) and triangular Bézier patch (2B). Two polynomials f and $\tilde{f}$ of degree d join r times differentially across the common edge of two triangles $\tau=\{v_1, v_2, v_3\}$ and $\tilde{\tau}=\{v_4, v_3, v_2\}$, if and only if:

$$\tilde{b}_{\rho,j,k} - \sum_{\mu+\nu+\kappa=\rho} \frac{\rho!}{\mu!\nu!\kappa!} b_{\mu,k+\nu,j+\kappa} \gamma_1^\mu \gamma_2^\nu \gamma_3^\kappa = 0, \quad (9)$$

$$j+k+\rho=d, \rho=0,\ldots,r,$$

where $\gamma_1, \gamma_2, \gamma_3$ are the barycentric coordinates of vertex $v_4$ with respect to triangle $\tau$. For example, FIGS. 3A and 3B illustrate two triangular Bézier patches with $C^1$ continuity constraints. In FIG. 3A, two domain triangles are illustrated with $C^1$ constraints on Bézier ordinates and, in FIG. 3B, two Bézier patches are illustrated with $C^1$ continuity. In both, free nodes 30, whose values can be freely chosen, are shown. Also, dependent nodes 32 are determined by the free nodes 30 through the continuity constraints. The triangles where continuity constraints are imposed 34 are further illustrated. As can be seen in FIG. 3B, the control points in each shaded triangle pair 34 are coplanar. For better visualization of the underlying $C^d$ patch, the control net in FIG. 3B is shifted up slightly.

Splines on Triangulations

Consider a parametric domain $\hat{\Omega}$ and its triangulation $\hat{T}$. Then, introduce the spline spaces of piecewise polynomials of degree d over $\hat{T}$:

$$S_d^r(\hat{T})=\{f \in C^r(\hat{\Omega}): f|_\tau \in P_d \forall_\tau \in \hat{T}\}, \quad (10)$$

where $\tau$ is an arbitrary triangle in $\hat{T}$ and r is the continuity order of the spline over $\hat{\Omega}$. In addition, if the spline has higher smoothness at some vertices or across some edges, the spline can be considered a superspline and the associated space denoted as:

$$S_d^{r,\rho}(\hat{T})=\{f \in S_d^r(\hat{T}): f \in C^{\rho_v}(v) \forall v \in V \& f \in C^{\rho_e}(e) \forall e \in E\} \quad (11)$$

where V and E are the set of all vertices and edges respectively in $\hat{T}$ and $\rho:=\{\rho_v\}_{v \in V} \cup \{\rho_e\}_{e \in E}$ with $r \leq \rho_v, \rho_e \leq d$ for each $v \in V$ and $e \in E$.

There are several approaches to obtain $C^r$ spline spaces on a triangulated domain $\hat{\Omega}(\hat{T})$. With respect to the spaces $S_d^r$ and $S_d^{r,\rho}$ with full approximation power of d-th degree polynomials, condition equation (9) can be applied directly on the triangles, which requires the degree of the polynomial much higher than r, such as $d \geq 3r+2$. An alternative strategy is to split each triangle in $\hat{T}$ into several micro-triangles before imposing the continuity constraints on the micro-triangles. The original triangles are then called macro-triangles. These include the Clough-Tocher (CT) split with polynomials of degree $d \geq 3r$ for continuity r-odd and $d \geq 3r+1$ for r-even, and the Powell-Sabin (PS) split with polynomials of degree $$d \geq \frac{9r-1}{4}$$

for r-odd and of degree $$d \geq \frac{9r+4}{4}$$

for r-even. For example, CT split may be used to obtain $S_3^1$ spline space with cubic polynomials, and PS split may be used to obtain $S_2^1$, $S_5^2$ and $S_5^{2,3}$ spline spaces with quadratic and quintic polynomials, respectively. The so-called polynomial macro-element technique may be used to obtain $S_5^1$ and $S_5^{1,2}$ spline spaces with quintic polynomials without using any split technique.

Figure 4A:
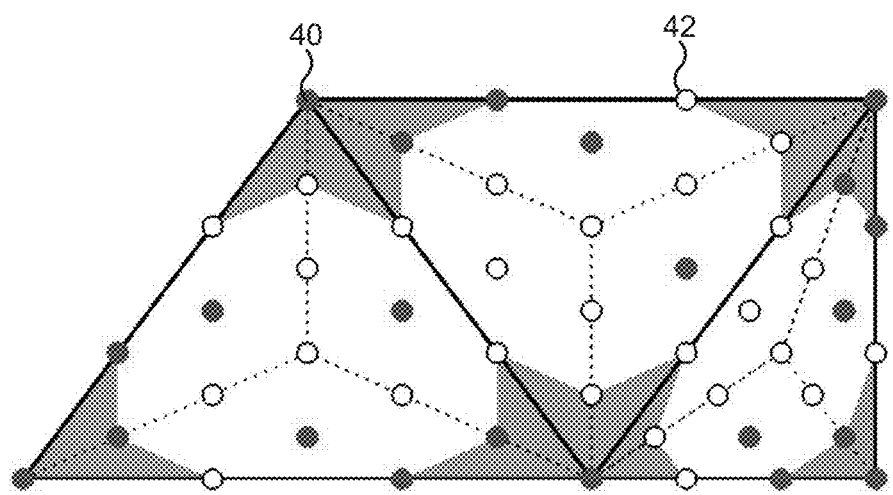
FIG. 4A is a graphic illustration of a cubic $C^1$ mesh using Clough-Tocher (CT) split.
Figure 4B:
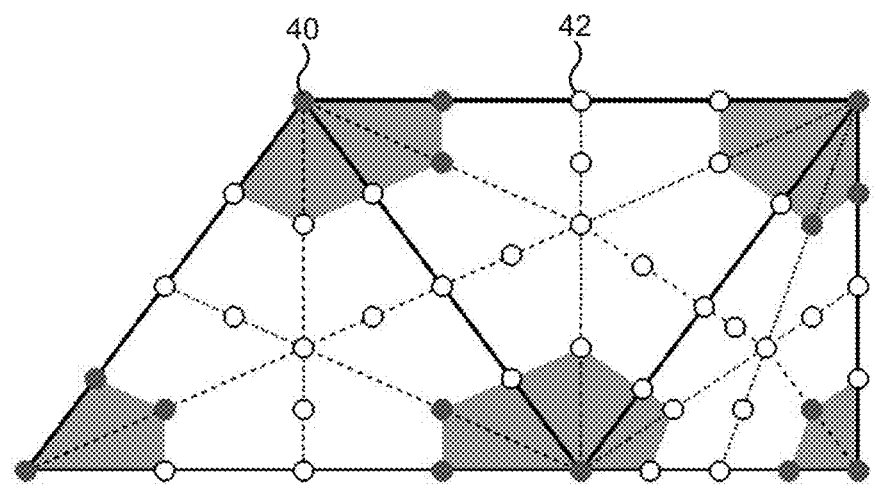
FIG. 4B is a graphic illustration of a quadratic $C^1$ mesh using Powell-Sabin (PS) split.

Specifically, FIGS. 4A and 4B show the CT and PS splits, respectively, with corresponding free points 40 and dependent domain points 42. In the CT split illustrated in FIG. 4A, each vertex of a triangle in $\hat{T}$ is connected with its centroid point to form three micro-triangles. This resulting triangulation is denoted as $\hat{T}_{ct}$. In the PS split, each triangle is connected along lines from its incenter to each of the three vertices and connected from incenter to a common edge between triangles. In addition, the middle of each boundary edge to the incenter of the associated triangle is connected, to thereby create six micro-triangles. In this implementation, the centroid point, instead of the incenter of each triangle, is used as the interior split point and the resulting triangulation is denoted as $\hat{T}_{ps}$.

Uniform refinement can also be performed as needed. For example, each triangle can be subdivided into four sub-triangles by connecting the middle points of the edges. This kind of 1-to-4 split based uniform refinement is used in our subsequent analysis of convergence during mesh refinement.

Automatic Domain Parametrization with $C^r$ rTBS

As will be described, a method is provided for discretizing a physical domain $\Omega$ into a collection of rational Bézier triangles without any geometric approximation error. Given an arbitrary 2D domain $\Omega$ and its NURBS-represented boundary $\Gamma$, we seek a geometric map $G(\xi), \xi \in \hat{\Omega}$ such that the physical domain $\Omega$ is the image of the geometric map $G(\xi)$ over a parametric domain $\hat{\Omega}$ where the physical boundary is reproduced by the map. In addition, the geometric map $G(\xi)$ is continuous and differentiable up to any desired degree of continuity $C^r$.

Figure 5:
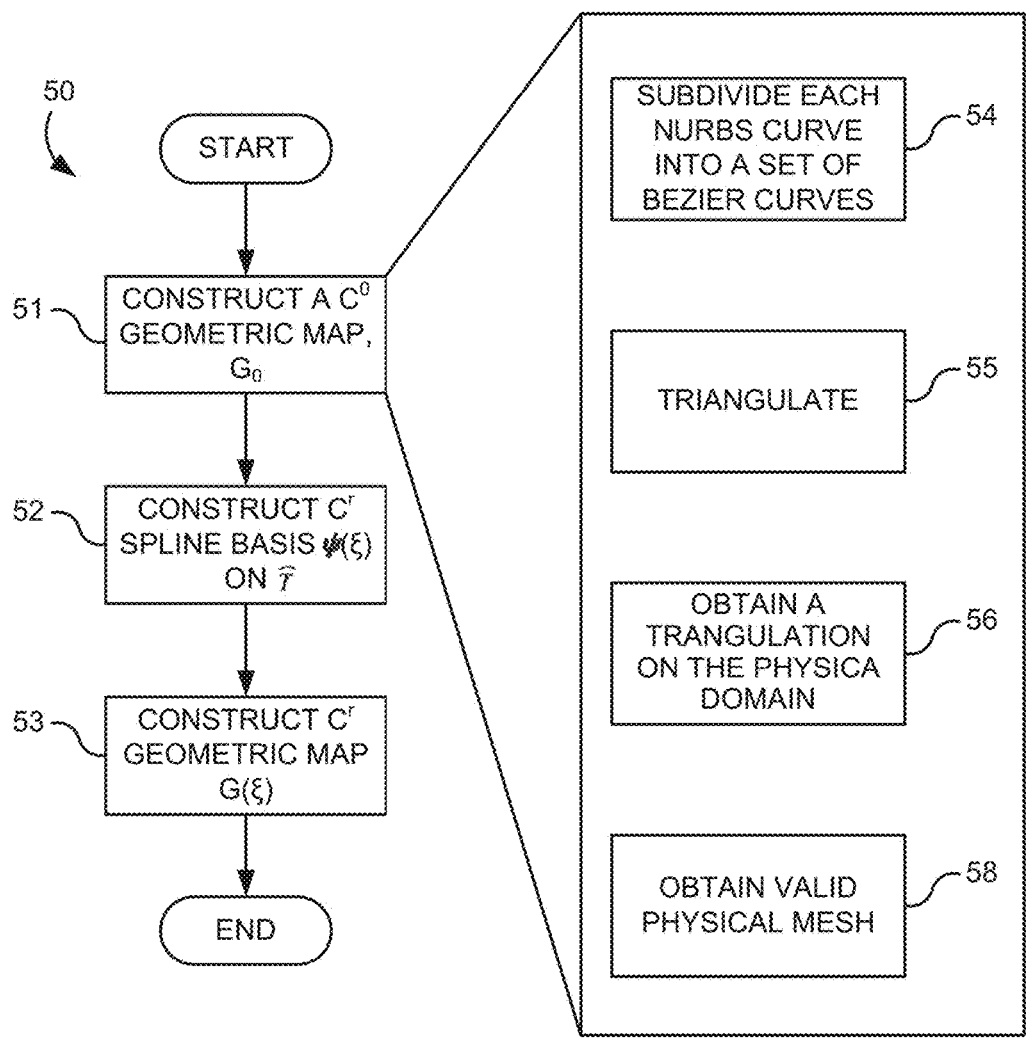
FIG. 5 is a flow chart setting forth steps of a process for automatic domain parameterization.

This can be achieved in three general steps that form a process 50, as illustrated with respect to FIG. 5. First, form a polygonal parametric domain $\hat{\Omega}$ and its triangulation $\hat{T}$ from the given physical domain $\Omega$ and the triangulation $T_0$, as illustrated at process block 51. Establish a $C^0$ geometric map $G_0$ between them: $G_0: \hat{\Omega}_T \mapsto \Omega_{T_0}$. Second, at process block 52, construct a set of $C^r$ basis $\psi(\xi)$ on $\hat{\Omega}$. Third, at process block 53, construct a $C^r$ continuous triangulation T of $\Omega$ and establish a globally $C^r$ geometric map $G(\xi)$ from the parametric domain $\hat{\Omega}_{\hat{T}}$ to the physical domain $\Omega_T$. As will be described, this process can be improved with additional control against possible self-intersection in the physical mesh.

Construction of a $C^0$ Geometric Map $G_0$

Figure 6A:
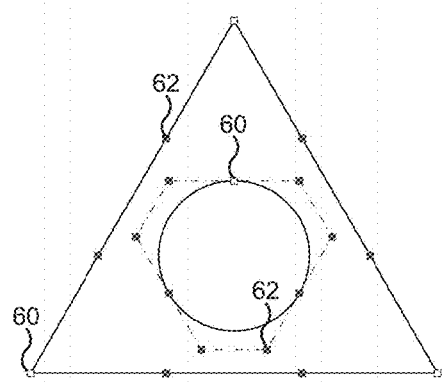
FIG. 6A is a graphic illustration of an input domain with NURBS boundary.
Figure 6B:
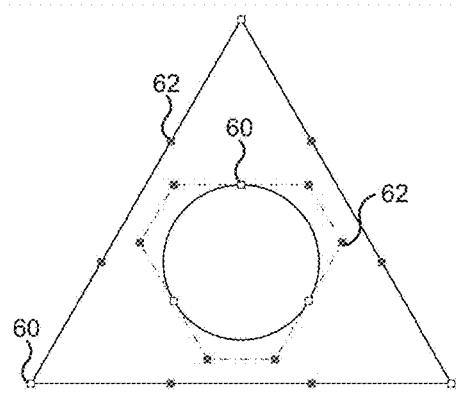
FIG. 6B is a graphic illustration of the input with Bézier extraction.
Figure 6C:
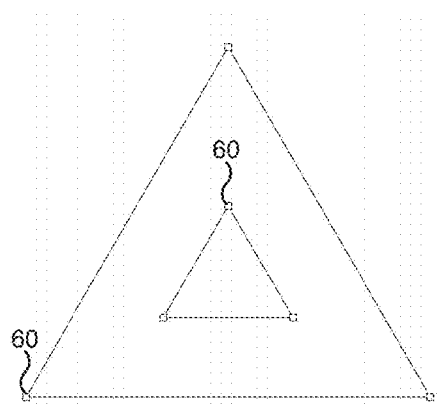
FIG. 6C is a graphic illustration of the input with polygonal parametric domain.
Figure 6D:
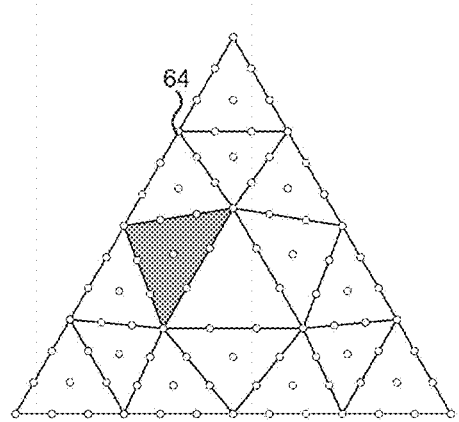
FIG. 6D is a graphic illustration of the input with parametric mesh with domain points.
Figure 6E:
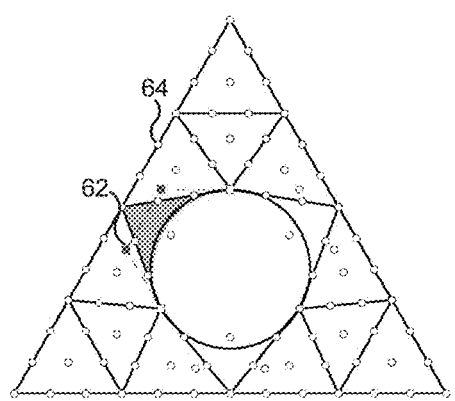
FIG. 6E is a graphic illustration of the input with physical mesh after boundary replacement.
Figure 6F:
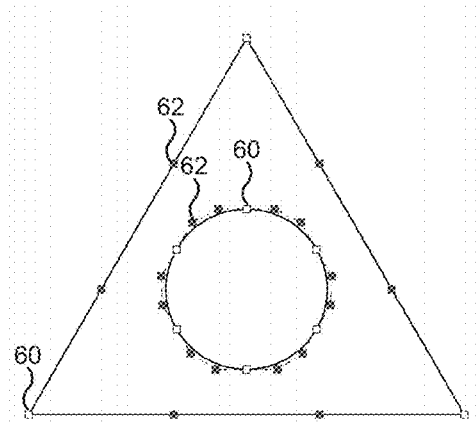
FIG. 6F is a graphic illustration of the input with local subdivision on the circle.
Figure 6G:
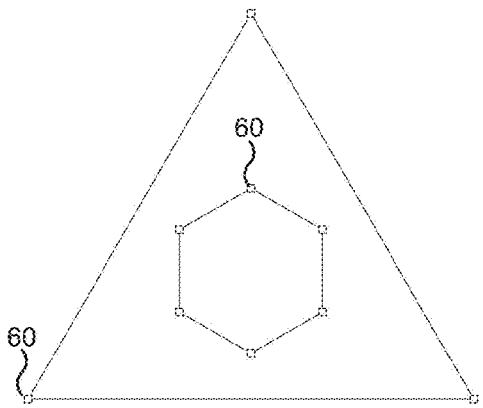
FIG. 6G is a graphic illustration of the input with a new parametric domain.
Figure 6H:
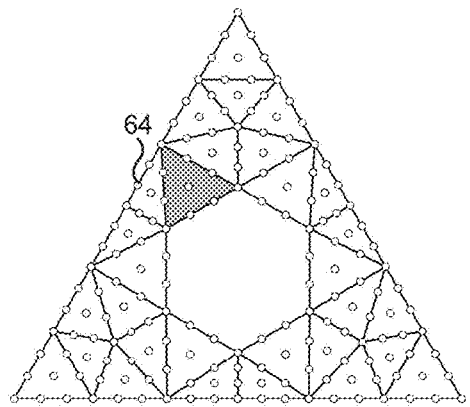
FIG. 6H is a graphic illustration of the input with a new parametric mesh.
Figure 6I:
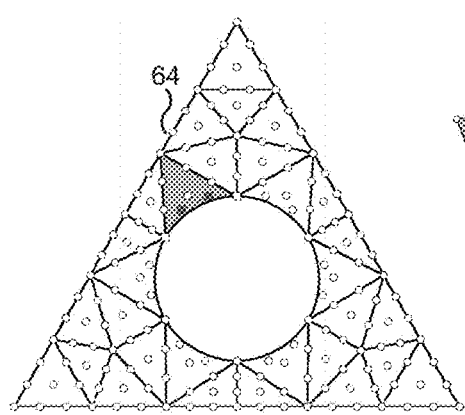
FIG. 6I is a graphic illustration of the input with a new physical mesh after boundary replacement.
Figure 6J:
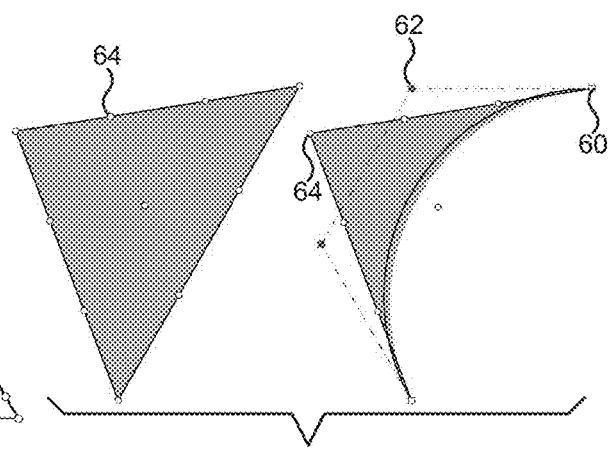
FIG. 6J is a detailed view of boundary replacement for a portion of FIG. 6(e)
Figure 6K:
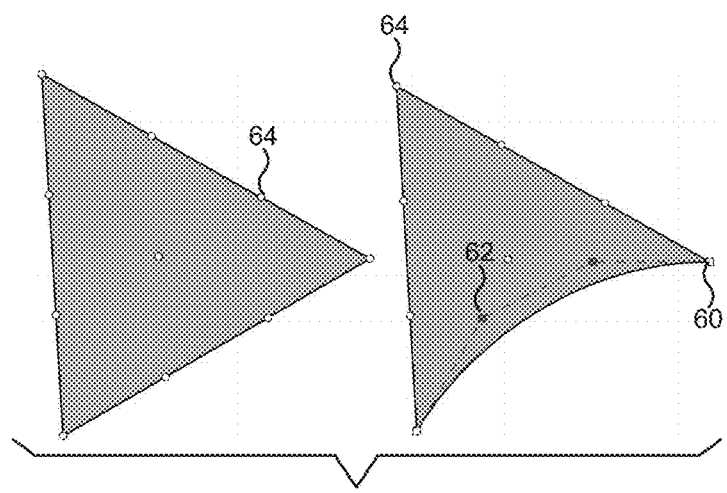
FIG. 6K is a detailed view of boundary replacement for a portion of FIG. 6(i)

Referring to FIGS. 5 and 6A-6I, the process for constructing a parametric and physical mesh $\hat{\Omega}_{\hat{T}}$ and $\Omega_T$ for a given input domain bounded by NURBS curves can be described. In FIG. 6, end points 60 and interior control points 62 of NURBS curves are shown along the boundaries, as are the domain points 64 and control points of the mesh. Referring to FIGS. 5 and 6A, at process block 54, given a domain $\Omega$ with NURBS boundary curves of degree d, each NURBS curve can be subdivided into a set of Bézier curves via knot insertions, such as illustrated in FIG. 6B. At process block 55, the end points of these Bézier curves are connected to form a polygonal parametric domain $\hat{\Omega}$, as illustrated in FIG. 6C, and the domain $\hat{\Omega}$ is triangulated using Delaunay triangulation to obtain $\hat{\Omega}_{\hat{T}}$ and the associated domain points are generated according to Eq. 8, as illustrated in FIG. 6D. The quality of the parametric mesh may also be improved by using appropriate techniques such as a smoothing method, such as described in N. Jaxon, X. Qian, Isogeometric analysis on triangulations, Computer-Aided Design 46 (2014) 45-57, which is incorporated herein by reference in its entirety. At process block 56, the boundary control points of $\hat{\Omega}_{\hat{T}}$ with corresponding control points of the Bézier curves in the physical domain can be replaced to obtain a triangulation $T_0$ on the physical domain, such as illustrated in FIG. 6E. Thereafter, the physical mesh $T_0$ may be checked to see if there is self-folding. As illustrated in FIG. 6J, for example, this may happen because of the over recessed control points, the control polygon of the curved boundary intersects with the other two boundaries of the element, causing self-folding of the mesh. If so, the Bézier boundary curve can be subdivided where self-folding occurs and repeat steps (2)-(3) until a valid physical mesh $T_0$ is obtained, as illustrated in FIGS. 6F, 6G, and 6H. On the other hand, as illustrated in 6K, the control polygon of the curved boundary may be contained between the other two boundaries of the element, the mesh is clear of self-folding and a valid physical mesh $T_0$ is obtained, as illustrated in FIG. 6I and process block 58.

Construction of $C^r$ spline basis $\psi(\xi)$ on $\hat{T}$

Let $\mathcal{D}_{d,\hat{T}}$ denote the set of domain points for triangulation $\hat{T}$ as defined in equation (8), $v \in \mathcal{D}_{d,\hat{T}}$ a domain point and $b_v$ its ordinate. A piecewise polynomial function $f(\xi) \in S_d$, $\xi \in \mathbb{R}^2$ can be expressed in terms of the rational $C^0$ Bernstein basis $\phi$ and corresponding nodal ordinates $b\mathcal{D}_{d,\hat{T}}$ as:

$$f(\xi) = \sum_i b_i \phi_i(\xi) = b_{\mathcal{D}_{d,\hat{T}}}^T \phi(\xi). \tag{12}$$

Further, for a $C^r$ continuous spline $f \in S_d^r$, the $C^r$ smoothness conditions in equation (9) among the Bézier ordinates imply that we cannot assign arbitrary values to every coefficient of f. Instead, only certain coefficients corresponding to a reduced determining set of domain points $\mathcal{M}_{d,\hat{T}} \subset \mathcal{D}_{d,\hat{T}}$ can be assigned, and all remaining coefficients may be determined by the smoothness conditions. When $\mathcal{M}_{d,\hat{T}}$ is the smallest set among all possible determining sets, we call $\mathcal{M}_{d,\hat{T}}$ a minimal determining set (MDS) and the domain points in it free nodes. We define a set of basis $\psi(\xi)$ for the spline space $S_d^r(\hat{T})$ in terms of these free nodes as:

$$\psi(\xi) = \{\psi_v \in S_d^r(\hat{T}) : b_v b_u = \delta_{v,u}, \forall u, v \in \mathcal{M}_{d,\hat{T}}\}, \tag{13}$$

where $\psi_v$ is the basis function at domain point v and $\delta_{v,u}$ is the Kronecker delta.

The construction of such explicit MDS and, hence, the basis of the underlying spline space is not a trivial task. One approach is direction construction through macro-elements. That is, according to the connectivity of the triangle elements in a specific triangulation, one can directly choose a set of free domain points based on which all other domain points are determined through necessary continuity constraints. This will be referred hereinto as the direct construction (DC) method and the resulting spaces as macro-element spaces. Some examples include quintic $C^1$ polynomial macro-element space $S_5^{1,2}(\hat{T})$, quadratic $C^1$ PS macro-element space $S_2^1(\hat{T}_{ps})$, cubic $C^1$ CT macro-element space $S_3^1(\hat{T}_{ct})$, and quintic $C^2$ PS macro-element space $S_5^{2,3}(\hat{T}_{ps})$, where $S_5^{1,2}(\hat{T})$ and $S_5^{2,3}(\hat{T}_{ps})$ are in fact superspline spaces with $S_5^{1,2}(\hat{T})$ having $C^2$ super-smoothness at every vertex and $S_5^{2,3}(\hat{T}_{ps})$ having $C^3$ super-smoothness at every vertex and splitting point of the macro-elements and across the three interior edges not connecting to the vertices of each macro-element.

Alternatively, the MDS can also be constructed by analyzing a homogeneous linear system of the smoothness conditions using equation (9) for all pairs of triangles sharing an interior edge, which is:

$$Ab\mathcal{D}_{d,\hat{T}} = 0 \tag{14};$$

where A is a coefficient matrix depending on the geometry of the domain triangles and $b\mathcal{D}_{d,\hat{T}}$ are n Bézier ordinates for the domain points in $\mathcal{D}_{d,\hat{T}}$. The dimension of the space $S_d^r(\hat{T})$ is:

$$\dim S_d^r(\hat{T}) = \dim S_d^0(\hat{T}) - \text{rank } A. \tag{15}$$

Revealing the rank of A requires Gaussian elimination (GE). However, this is challenging in floating point arithmetic for geometry with degeneracies, which would lead to increased rank deficiencies of A and can be easily obscured by inexact computations. To overcome such issue, a modified Gaussian elimination procedure based on residual arithmetic has been presented. This method makes use of the fact that the vertices of the triangulation are pixels and the coordinates of the pixels are integers.

In accordance with the present disclosure, besides the DC method, the standard GE method can be used with complete pivoting to construct the MDS. For example, the GE method can be used in two types of situations. The first situation is for triangulations constructed through macro-elements, where the GE method can be used to identify stable basis for analysis. Although it is not based on residual arithmetic, it works well for the examples, such as will be provided. The second situation is for general triangulations where the goal is to obtain smooth pre-refinement geometric map, rather than stable basis.

With the known MDS, after some manipulations on matrix A, equation (14) can be transformed to the form:

$$b_{\mathcal{D}_{d,\hat{T}}} = C^T b_{\mathcal{M}_{d,\hat{T}}}; \tag{16}$$

where C is called the continuity matrix. For the convenience of applying Dirichlet boundary conditions conveniently, a boundary MDS is also enforced, which means the complete boundary will be uniquely determined by the free nodes on the boundaries only. This is accomplished by exchanging any free nodes with influence on the boundary with a constrained boundary node. A free node appears in C as a column with a single 1 that is otherwise all zeros. If a constrained boundary node is dependent on a free internal node, then by scaling this free basis row, and adding multiples of it to zero the boundary node's column, we replace the internal free node by one on the boundary. Combining equations (16) and (12), the $C^r$ continuous function f now can be expressed in terms of the free nodal ordinates $$b_{M_{d,\hat{T}}}$$

as $$f(\xi) = b_{D_{d,\hat{T}}}^T \phi(\xi) = b_{M_{d,\hat{T}}}^T C\phi(\xi) = b_{M_{d,\hat{T}}}^T \psi(\xi); \quad (17)$$

where:

$$\psi(\xi) = C\phi(\xi); \quad (18)$$

is a set of global $C^r$ basis functions composed as the linear combinations of the $C^0$ Bernstein basis $\phi(\xi)$.

Construction of $C^r$ Geometric Map $G(\xi)$

After identifying the free control points $p_i^f$ corresponding to the free domain points in $\mathcal{M}_{d,\hat{T}}$, all the control points p for rTBS elements in the physical mesh T may be overridden with a set of control points satisfying the $C^r$ continuity constraints:

$$p = C^T p^f, \quad (19)$$

In addition, the resulting $C^r$ mesh recovers the original NURBS boundary exactly.

Now the $C^r$ geometric map $G(\xi):\hat{\Omega}\to\Omega$ can be obtained in terms of rational $C^r$ basis functions $\psi_i(\xi)$, or equivalently, the rational $C^0$ Bernstein basis functions $\phi_j(\xi)$ as:

$$G(\xi) = \sum_i^m p_i^f \psi_i(\xi) = \sum_j^n p_j \phi_j(\xi), \quad (20)$$

where m and n are the dimension of the space $S_d^r$ and $S_d^0$ respectively.

Isogeometric Analysis Using rTBS Elements

Following herein, a method of isogeometric analysis using rTBS elements is described, where the classical Galerkin formulation is applied. The problems considered in the following include linear elasticity and Poisson problem.

The governing equation for the linear elasticity is:

$$\begin{cases} \nabla \cdot \sigma + b = 0 & \text{on } \Omega \\ \sigma = D\nabla_s u \\ \sigma \cdot n = t & \text{on } \Gamma_t \\ u = \bar{u} & \text{on } \Gamma_u, \end{cases} \quad (21)$$

where D is the elasticity matrix, b and t refer to body force and traction respectively, u is the displacement, $\Gamma_t$ and $\Gamma_u$ are the portions of the boundary, where traction and displacement are specified, respectively. The Poisson problem is defined as:

$$\begin{cases} -\nabla^2 u = f & \text{in } \Omega, \\ u = \bar{u} & \text{on } \Gamma, \end{cases} \quad (22)$$

where $f:\Omega\to\mathbb{R}$ is a given function and $\bar{u}$ denotes prescribed boundary values.

Using the basis constructed in the previous section, we approximate the solution in the corresponding parametric domain as:

$$\hat{u}(\xi) = \sum_i u_i \psi_i(\xi) = u^T \psi; \quad (23)$$

where $u_i$ corresponds to the approximate solution's Bézier ordinate at the i-th domain point in the parametric domain $\hat{\Omega}_{\hat{T}}$, as illustrated in FIG. 1. The solution u(x) over the domain $\Omega_T$ in the physical space is obtained by composing $\hat{u}(\xi)$ with the inverse of the geometric mapping $G^{-1}$ such that $u(x):\Omega\mapsto\mathbb{R}^2$, where:

$$u(x) = \hat{u}(\xi) \circ G^{-1}(x). \quad (24).$$

After inserting the approximate solution and basis functions into the corresponding weak form of the PDE, we obtain the following mass and stiffness matrices, respectively:

$$M_0 = \int_\Omega \phi \cdot \phi \, d\Omega, \quad (25);$$

$$K_0 = \int_\Omega \nabla\phi \cdot \nabla\phi \, d\Omega, \quad (26);$$

for $C^0$ elements. For $C^r$ elements. The mass and stiffness matrices are calculated using the fact that the $C^r$ basis $\psi$ are linear combinations of $C^0$ basis $\phi$:

$$M_r = \int_\Omega \psi \cdot \psi \, d\Omega = \int_\Omega (C\phi) \cdot (C\phi) d\Omega = C^T \tilde{M}_0 C, \quad (27);$$

$$K_r = \int_\Omega \nabla\psi \cdot \nabla\psi \, d\Omega = \int_\Omega (C\nabla\phi) \cdot (C\nabla\phi) d\Omega = C^T \tilde{K}_0 C, \quad (28);$$

where $M_0$ and $\tilde{K}_0$ are the mass and stiffness matrices respectively for the same $C^r$ elements in terms of the $C_0$ basis $\phi$. The difference between $\tilde{M}_0$ and $M_0$, $\tilde{K}_0$ and $K_0$ is due to the potential relocation of the control points to satisfy the $C^r$ continuity constraints for the $C^r$ elements. The assembly process for such matrices is different from the one described in N. Jaxon, X. Qian, Isogeometric analysis on triangulations, Computer-Aided Design 46 (2014) 45-57, where the entries in $M_r$ and $K_r$ are calculated directly after identifying the basis function $\psi_i$ supporting each element from the continuity matrix C. Instead, $\tilde{M}_0$ and $\tilde{K}_0$ are assembled first using the $C^0$ basis $\phi$ as in classical $C^0$ FEM and then multiplied by the continuity matrix C to obtain $M_r$ and $K_r$ as shown in equations (27) and (28). This implementation can be readily applied in any existing FEM routine without changing the assembly process. The numerical integration is performed in each element (micro-element if split is used) by using standard and collapsed Gaussian quadrature rules on the boundaries and element interiors respectively. Specifically, the integrals are first pulled back onto the parametric domain and then onto a parent element of right-angled isosceles triangle, as shown in FIG. 1.

Due to the use of boundary MDS mentioned earlier, the Dirichlet boundary conditions can be imposed similarly as in NURBS based IGA. Typical strategies include the least square method (used herein), weak imposition using Lagrange multiplier, and an improved transformation method.

Approximation Property of the rTBS Space

It is already known that the set of Bernstein basis functions of degree d over a triangulation form a basis for the polynomial space of degree d. Thus for $C^0$ basis, the same error estimate holds as for classical finite element methods and optimal convergence rates can be guaranteed. In this section, we focus on how well $C^r$ continuous functions can be approximated by rTBS.

It has been proven in M. Lai, L. Schumaker, Spline functions on triangulations, Vol. 110, Cambridge University Press, 2007, which is incorporated herein by reference in its entirety, that, if there exists a subspace of $S_d^r(\hat{T})$ with a stable local minimal determining set, then $S_d^r(\hat{T})$ has the approximation power up to d+1. That is, for every $f \in H^{d+1}$, there exists a spline $s \in S_d^r(\hat{T})$ such that:

$$|f-s|_{W^{k,d+1}(\hat{\Omega})} \leq Ch_{\hat{T}}^{d+1-k}|f|_{W^{d+1,d+1}(\hat{\Omega})}, \quad 0 \leq k \leq d. \quad (29)$$

where $H^k$ and $W^{k,p}$ are the Hilbert and Sobolev spaces respectively with $\|\cdot\|$ the associated seminorm, $h_{\hat{T}}$ is the length of the longest edge in T, the constant C depends only on d and the smallest angle in T, and the Lipschitz constant of the boundary of $\Omega$.

Figure 7:
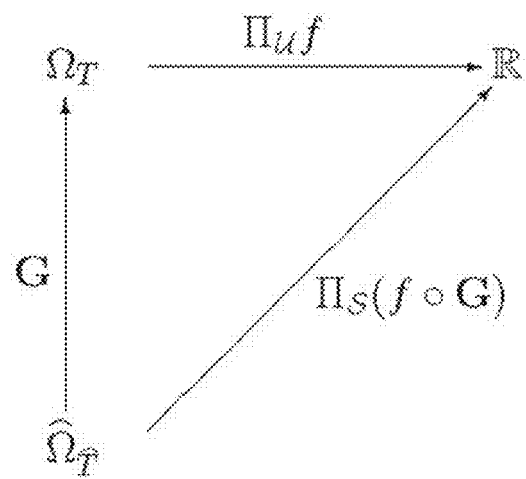
FIG. 7 is a graphic illustration showing $\Pi_u f$ is the push-forward of the rTBS projector $\Pi_S(f \circ G)$, where $f \in L^2(\Omega)$ and $f \circ G \in L^2(\hat{\beta})$.

Although the result relative to equation (29) is derived in the TBS space, following NURBS based IGA, a similar result in the rTBS space can be derived as:

$$|f - \Pi_S f|_{H^k(\tau)} \leq C_w h_{\hat{T}}^{d+1-k}|f|_{W^{d+1,d+1}(\hat{\Omega})}, \quad (30)$$

$$\forall f \in H^{d+1}, 0 \leq k \leq d.$$

where $\Pi_S$ is the projector on the rTBS space $S_d^r$, the constant $C_w$ differs from C by the extra dependence on the weight function w and $\tau$ is an element in the triangulation T. Finally we define the projector $\Pi_u: L^2(\Omega) \to u_d^r$ as:

$$\Pi_u f := (\Pi_S(f \circ G)) \circ G^{-1}, \forall f \in L^2(\Omega), \quad (31);$$

where $u_d^r$ is the space of rTBS on the physical domain $\Omega$ (the push-forward of the rTBS space $S_d^r$ on the parametric domain $\hat{\Omega}$), as shown in FIG. 7.

Now the error estimate on the physical domain $\Omega$ can be derived as:

$$|f - \Pi_u f|_{H^k(T)} \leq C_w h_T^{d+1-k} \sum_{i=0}^{d+1} \|\nabla G\|_{L^\infty(G^{-1}(T))}^{i-d-1} |f|_{H^i(T)}, \quad (32)$$

$$\forall f \in H^{d+1}(\Omega).$$

where G is the geometric map, $T = G(\hat{T})$, and $h_T$ is the longest element edge in T. Thus, equation (32) implies the rTBS space on the physical domain delivers the optimal rate of convergence, which is $d+1-k$ in terms of the error norm in $H^k$ space for polynomials of degree d, provided that there is a set of local stable basis for $S_d^r$ and the geometric map G remains the same for different mesh size $h_T$.

Pre-Refinement Smooth Geometric Map

As shown above, in order to evaluate the convergence rate upon h-refinement, the geometric map must remain the same during refinement. As will follow, the need for a smooth pre-refinement geometric map will be shown. Then a strategy to construct a pre-refinement geometric map will be introduced that possesses sufficient smoothness to maintain the consistency of the geometric map for all subsequent refinements. Thus, the basis for a "smooth-refine-smooth" approach, in accordance with the present disclosure, will be provided.

Need for a Pre-Refinement Smooth Geometric Map

Let $\Delta_0 \subset \Delta_1 \subset \Delta_2 \subset \ldots \subset \Delta_n$ be a nested sequence of triangulations, where $\Delta_{k-1} \subset \Delta_k$ means $\Delta_k$ is a refinement of $\Delta_{k-1}$ by subdividing each triangle in $\Delta_{k-1}$ into several sub-triangles. We denote the $C^r$ spline space defined on $\Delta_k$ as $S_d^r(\Delta_k)$. If the mesh sequences in the parametric domain are nested, that is, $\hat{T}_0 \subset \hat{T}_1 \subset \hat{T}_2 \subset \ldots \subset \hat{T}_n$, and the resulting triangulations in the physical domain under the geometric map $G_k: \hat{T}_k \mapsto T_k$ are also nested as $T_0 \subset T_1 \subset T_2 \subset \ldots \subset T_n$, then the geometric map $G_k$ for the space $S_d^r(\Delta_k)$ is said to be consistent during the refinement sequence.

For accurate isogeometric analysis with $C^r$ rTBS elements, elements need to be sufficiently small. One way to first obtain $C^0$ coarse mesh from the procedure outlined above with respect to the construction of a $C^0$ geometric map $G_0$, perform uniform refinement on the $C^0$ mesh until the elements are small enough for accurate analysis, and then impose $C^r$ smoothness constraints through a macro-element based DC technique or GE. That is, for space $S_d^r$, first create a nested sequence of triangulations $T_0 \subset T_1 \subset T_2 \subset \ldots \subset T_n$ in the physical domain, and then impose $C^r$ continuity constraints on each mesh $T_k$ and relocate the dependent control points to ensure $C^r$ smoothness. Although such a "refine-then-smooth" approach is able to create arbitrarily small rTBS elements with desired continuity for analysis, the resulting geometric map may not be consistent during the refinement. That is, the resulting elements are not nested after the refinement. As such, optimal convergence cannot be achieved with such an approach. To demonstrate such a lack of consistency in the resulting $C^r$ geometric map with the "refine-then-smooth" approach, two examples will be discussed.

Lack of Consistency Example 1

The notation in various refinement and splits are as follows. The subscripts u,ct,ps are used to indicate uniform refinement, CT split and PS split, respectively, which are used in the same sequential order as these refinements are performed. The superscript indicates the order of smoothness. For example, $T_{ct,u,u,ps}^1$ represents a $C^1$ smooth mesh obtained by performing a CT split followed by two uniform refinements and a PS split on the mesh T. Note that the CT and PS split are usually followed by imposing continuity constraints. Here ct* and ps* are used to indicate the respective split without imposing continuity constraints.

Figure 8A:
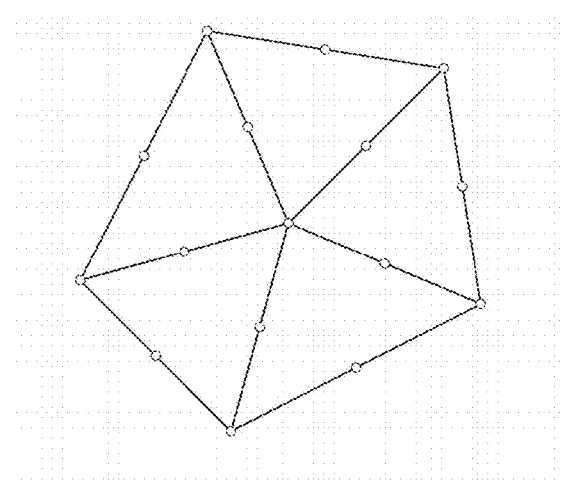
FIG. 8A is a graphic illustration of an initial quadratic parametric mesh $\hat{T}^0$.
Figure 8B:
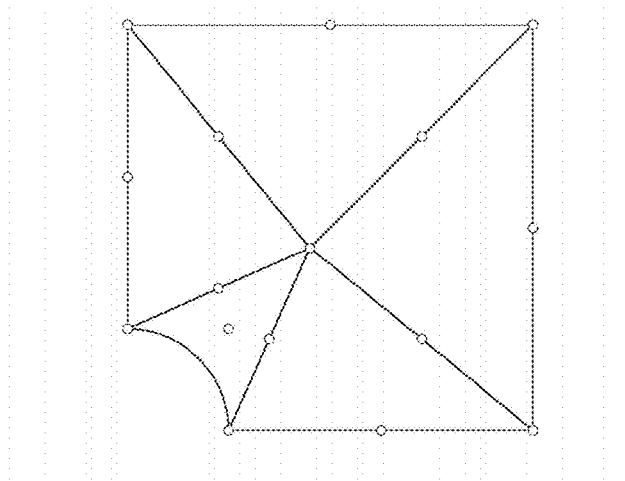
FIG. 8B is a graphic illustration of an initial quadratic physical mesh $T^0$.
Figure 9A:
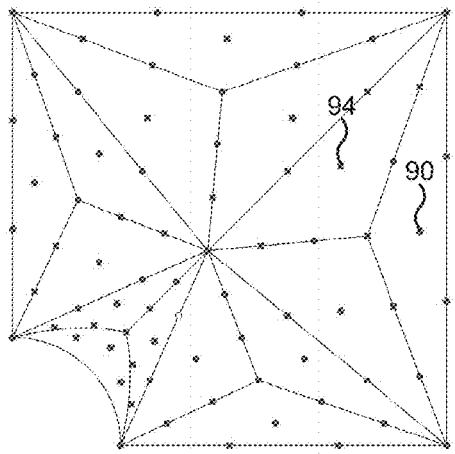
FIG. 9A is a graphic illustration of a refinement of the elements of FIG. 8B without imposing the continuity constraints illustrating $T_{ct*}^0$.
Figure 9B:
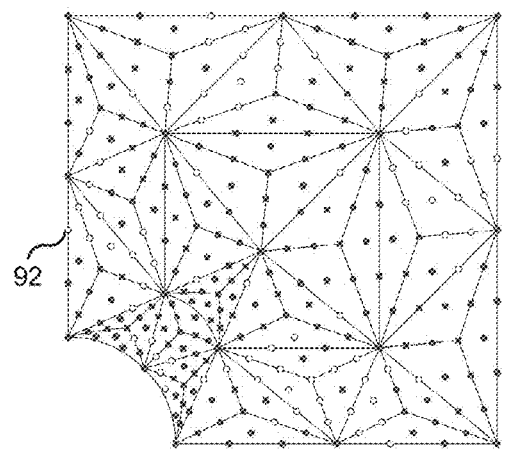
FIG. 9B is a graphic illustration of a refinement of the elements of FIG. 8B without imposing the continuity constraints illustrating $T_{u,ct*}^0$.
Figure 9C:
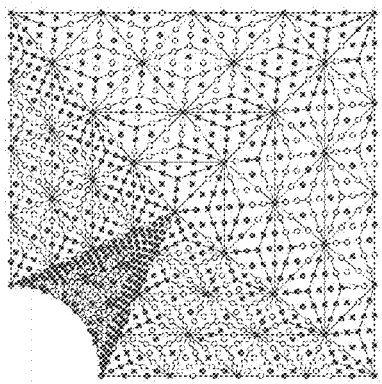
FIG. 9C is a graphic illustration of a refinement of the elements of FIG. 8B without imposing the continuity constraints illustrating $T_{u,u,ct*}^0$.
Figure 9D:
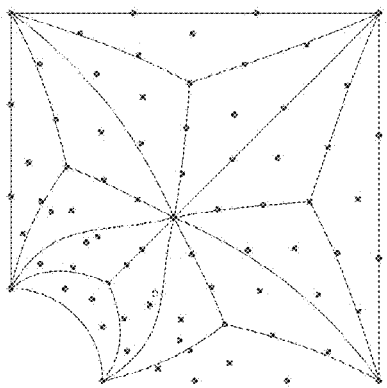
FIG. 9D is a graphic illustration of a refinement of the elements of FIG. 8B with $C^1$ continuity constraints illustrating $T_{ct}^1$.
Figure 9E:
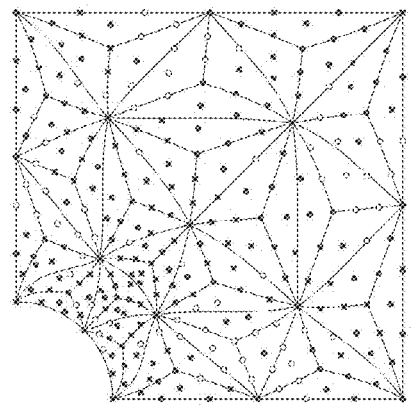
FIG. 9E is a graphic illustration of a refinement of the elements of FIG. 8B with $C^1$ continuity constraints illustrating $T_{u,ct}^1$.
Figure 9F:
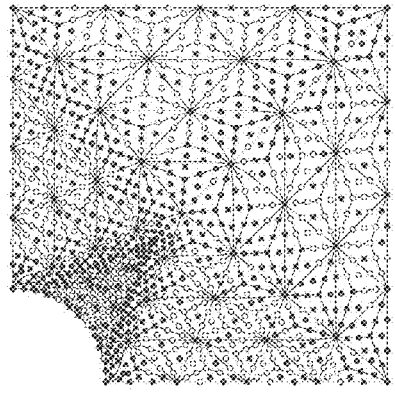
FIG. 9F is a graphic illustration of a refinement of the elements of FIG. 8B with $C^1$ continuity constraints illustrating $T_{u,u,ct}^1$.

An example is given below where a domain is initially parameterized into five $C^0$ elements, as shown in FIGS. 8A and 8B. Also, FIGS. 9A-9F shows a nested sequence of triangulations from such initial $C^0$ elements through uniform refinement. CT splits are then performed to obtain splines in the $S_3^1$ FIGS. 9A-9C are $C^0$ meshes before continuity constraints are actually imposed, where the free control points 90 are points that can be chosen freely, but continuity-satisfied, dependent control points 92 and non-continuity-satisfied, control points 94 are points that are determined through the continuity constraints. That is, continuity-satisfied, dependent control points 92 have already satisfied the continuity condition, while the non-continuity-satisfied, dependent control points 94 are not and need to be relocated to obtain $C^1$ smoothness. As can be seen, the non-continuity-satisfied, dependent control points 94 are distributed only near the common edges shared by the initial five elements in FIG. 8B. After relocating the control points, as shown in FIGS. 9D-9F, the meshes have been locally changed and are no longer nested. The relocation of some control points $p_i$ (the non-continuity-satisfied, dependent control points 94) to satisfy the continuity constraints, thus, leads to a change of the geometric map according to equation (20).

Lack of Consistency Example 2

Figure 10A:
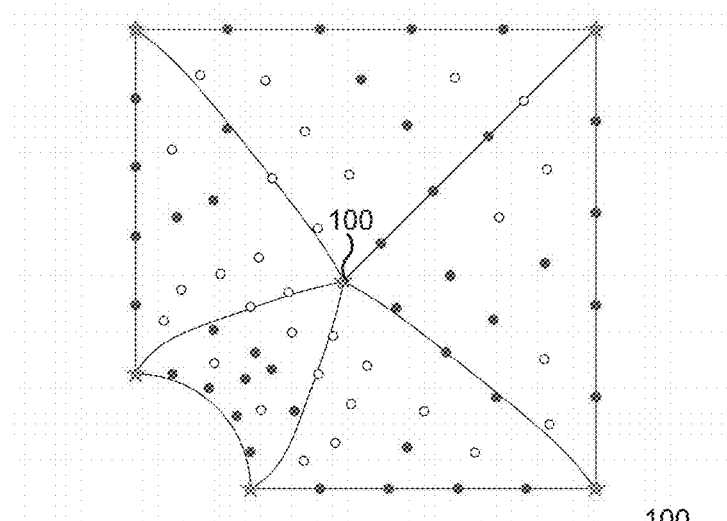
FIG. 10A is a graphic illustration of an initial mesh, $T^{1,2}$.
Figure 10B:
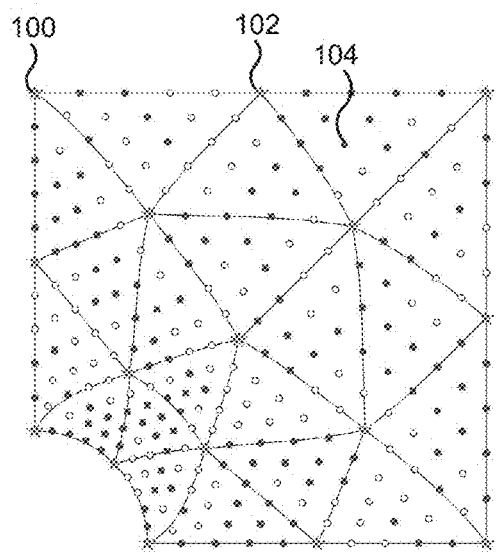
FIG. 10B is a graphic illustration of the initial mesh of FIG. 10A with one refinement, $T_u^{1,2}$.
Figure 10C:
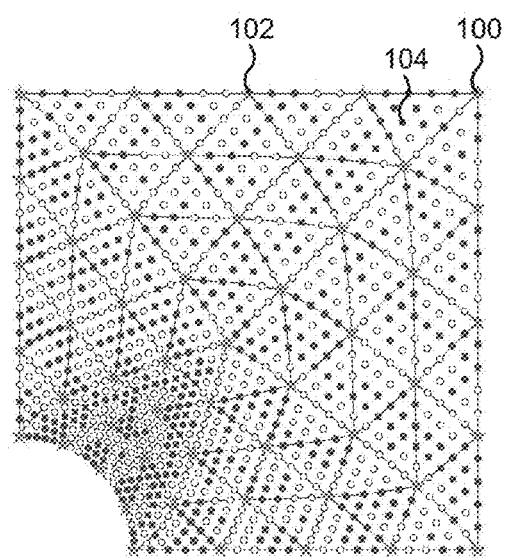
FIG. 10C is a graphic illustration of the refined mesh of FIG. 10A with two refinements, $T_{u,u}^{1,2}$ (what do the colors of the points mean?)

The second example concerns a kind of macro-elements in the superspline space $S_d^{r,\rho}$, $\rho > r$, as defined in equation (11), where super-smoothness $C^\rho$ happens at the vertices or edges of the macro-triangles. Uniform refinement of such elements followed by the same macro-element technique to achieve super-smoothness at macro-element vertices or edges would lead to inconsistent geometric maps. An example is given in FIGS. 10A-10C. Specifically, the initial mesh is illustrated in FIG. 10A in superspline space $S_5^{1,2}$ obtained by DC based on the quintic $C^1$ macro-element technique. This initial mesh is globally $C^1$ but with $C^2$ smoothness at the vertices of macro-triangles. If this initial $T^{1,2}$ mesh is refined as shown in FIG. 10B where the smoothness at the points 100 are $C^2$ and the smoothness at points 102 in the refined mesh is still $C^1$. In order to obtain stable basis in the $S_5^{1,2}$ with the same macro-element technique, all macro vertices need to be $C^2$ smooth. Thus, the control points 104 need to be relocated to achieve $C^2$ smoothness at all macro vertices, since many of the control points only possess $C^1$ smoothness before refinement. As the mesh is refined, as illustrated in FIG. 10C, there are more and more vertices that need to be relocated to achieve $C^2$ smoothness. Such relocation of control points to achieve higher-order smoothness at more and more vertices and edges of refined macro-triangles, due to super-smoothness requirement at vertices of macro-triangles in the $S_5^{1,2}$ macro-element space, leads to the loss of consistency of the geometric map.

Solution

To overcome such inconsistency of the geometric map during the refinement, a geometric map with sufficient smoothness may be constructed before the refinement. For the usual $C^r$ splines, the pre-refinement geometric map may be at least $C^r$ smooth. For superspline space $S_d^{r,\rho}$ where super-smoothness occurs at the vertices or edges of macro-triangles, a $C^\rho$ pre-refinement map may be constructed before the refinement. In this way, all subsequent refined elements are globally $C^\rho$ smooth and the super-smoothness required at those vertices and edges are therefore satisfied. The refinement sequence is nested and the geometric map remains unchanged.

Note if super-smoothness happens at the interior vertices or edges of macro-triangles after the splits, refinement of such elements does not need to relocate dependent control points to satisfy the continuity constraints. This is because, at these internal vertices and edges of a macro-triangle, the continuity is already $C^\infty$. For example, although the quadratic $C^1$ PS macro-element and cubic $C^1$ CT macro-element spaces are also superspline spaces, their super-smoothness occurs inside the macro-elements where the geometric smoothness is infinity. Thus, they can be treated as regular $C^r$ spaces in terms of smoothness requirement of the pre-refinement geometric map.

Construction of a Pre-Refinement Smooth Geometric Map

To control or avoid the inconsistency of the $C^r$ geometric map during the refinement, a pre-refinement map may be constructed. This pre-refinement map may be designed to meet a sufficiency criteria with respect to smoothness. The pre-refinement map can have refinements performed on it, and the $C^r$ continuity constraints can be followed to obtain stable basis for $C^r$ rTBS elements, such as discussed with respect to construction of $C^r$ spline basis $\psi(\xi)$ on $\hat{T}$. The refined mesh inherits the continuity. The refined control points, therefore, do not need to be relocated since they already satisfy the continuity conditions. Thus, the resulting meshes are $C^r$ smooth and nested, and the geometric map remains the same for all subsequent refinements.

A sufficiently smooth pre-refinement mesh for a given domain can be obtained, such as described above. For example, if the domain is bounded by straight line segments and recalling that the domain points in the parametric mesh satisfies the smoothness condition, the control points can be generated in the location obtained by an affine transformation of the domain points in the parametric mesh. In this case, the physical mesh obtained will satisfy the needed smoothness condition as well. If the domain has curved boundaries, a $C^r$ mesh can be constructed with a set of stable local basis (such as described above with respect to construction of $C^r$ spline basis $\psi(\xi)$) on or the control points can be relocated to satisfy the smooth conditions by Gaussian elimination.

Figure 11A:
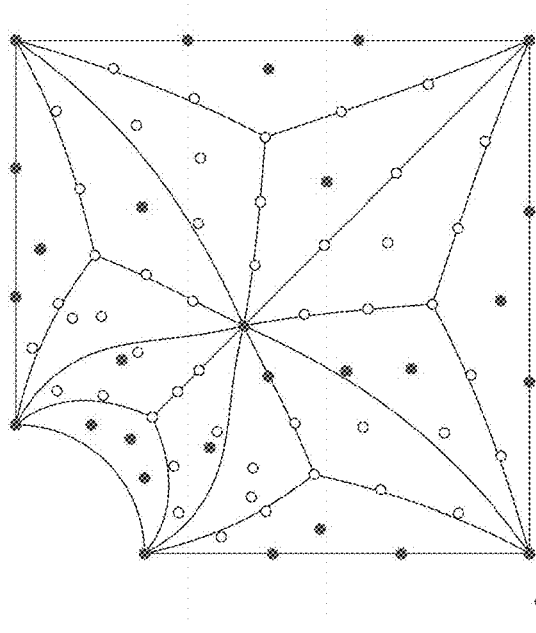
FIG. 11A is a graphic illustration showing a cubic $C^1$ mesh obtained by DC with CT macro-elements, where the space $s_3^1$ is well defined on a cubic mesh with CT macro-elements.
Figure 11B:
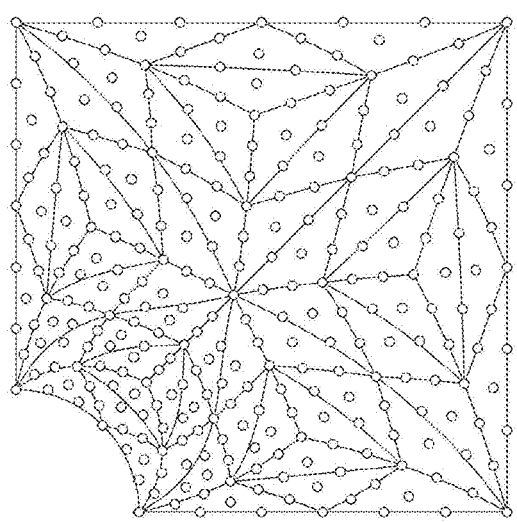
FIG. 11B is a graphic illustration showing a $C^1$ mesh after uniformly refining mesh of FIG. 11A, where the dimension of the space $s_3^1$ on this triangulation is unknown.
Figure 11C:
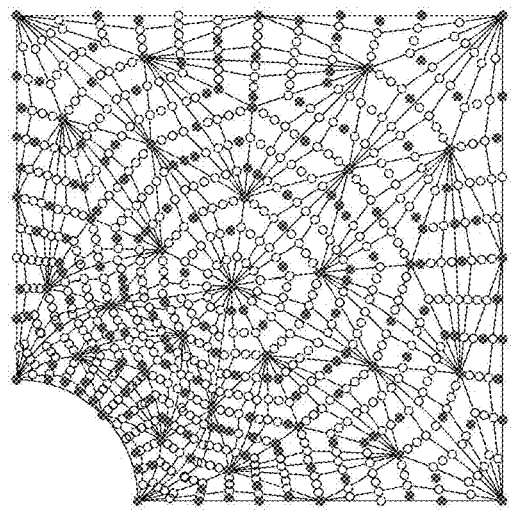
FIG. 11C is a graphic illustration showing a CT split is performed on the mesh of FIG. 11B to construct a set of stable local basis that defines $s_3^1$.

It is worthy to mention the difference between the pre-refinement $C^r$ smooth geometric map described here and the $C^r$ map described above with respect to construction of $C^r$ spline basis $\psi(\xi)$ on T. The reason for a pre-refinement smooth geometric map is geometric. That is, a $C^r$ map is created that maps the parametric domain to the physical domain and recovers the original boundary, without the need for a set of stable local basis for analysis. Such a smooth pre-refinement map is designed so that, during the refinement, the control points do not need to relocate since they would already satisfy the continuity conditions. Thus, the pre-refinement map is kept consistent during the refinement. On the other hand, in order to approximate a field in analysis, a set of stable basis should be constructed by the methods discussed with respect to construction of $C^r$ spline basis $\psi(\xi)$ on $\hat{T}$. For example, in cubic space $S_3^1(T_{ct})$ with CT split, a $C^1$ pre-refinement map can be created using CT split, as shown in FIG. 11A. Even if it is $C^1$ after uniform refinement, as illustrated in FIG. 11B, the CT split is performed again in order to construct a set of stable local basis in $S_3^1(T_{ct})$ to be used in analysis, as shown in FIG. 11C. Thus, FIGS. 11A-11C illustrate smooth-refine-smooth procedure, where the purpose of the first CT split is to construct a pre-refinement smooth geometric map, while the CT split at the last step is to construct a set of $C^1$ stable local basis for analysis.

Numerical Results

In the following discussion, "optimal convergence" rates are discussed, as is achieving "optimal convergence" using rTBS-based isogeometric analysis for different problems with different elements. First, this will be illustrated with respect to a domain bounded by straight line segments, where optimal convergence rates are achieved in all presented spaces. Then, with respect to domains with curved boundaries, if no pre-refinement smooth map is constructed to keep the $C^r$ geometric map consistent during refinement, the convergence rates will be shown to be lower than optimal. Then, with the pre-refinement smooth map as discussed above with respect to pre-refinement smooth geometric map, optimal convergence rates will be discussed. The results provided hereafter are demonstrated on two examples. A first is a Poisson problem on a complex domain with three holes and one elastic problem on a plate domain. We also show the advantage of local refinement in rTBS for the elasticity problem. Note, in all examples below, the element size in the convergence study refers to the maximal length of the edges in the micro-elements.

Domain with all Straight Boundaries: Poisson Problem

The first example is a triangular domain with a triangular hole as shown in FIGS. 12A-12F. All sides consist of straight line segments. The governing equation is equation (22) with the open set domain $\Omega$ being defined as:

$$\Omega := \qquad (33)$$
$$\left\{(x, y) \mid \left[\left(0 < x \leq \frac{3}{2}\right) \& \left(0 < y < 3\sqrt{3x}\right)\cup\left(\frac{3}{2} < x < 1\right) \& \right.\right.$$
$$\left.\left.\left(0 < y < 3\sqrt{3}(1-x)\right)\right]\setminus\right.$$

$$\left[\left(\frac{9}{8} \le x \le \frac{3}{2}\right) \& \left(\frac{3\sqrt{3}}{8} \le y \le 3\sqrt{3}\left(x-\frac{1}{4}\right)\right)\right] \cup \left\{\left(\frac{3}{2} < x \le \frac{15}{8}\right) \& \left(\frac{3\sqrt{3}}{8} \le y \le 3\sqrt{3}\left(\frac{3}{4}-x\right)\right)\right\}\right].$$

The body force is:

$$f(x,y) = -(x^2+y^2)e^{xy}, \quad (34).$$

and the exact solution is given by:

$$u(x,y) = e^{xy}, \quad (35).$$

Figure 12A:
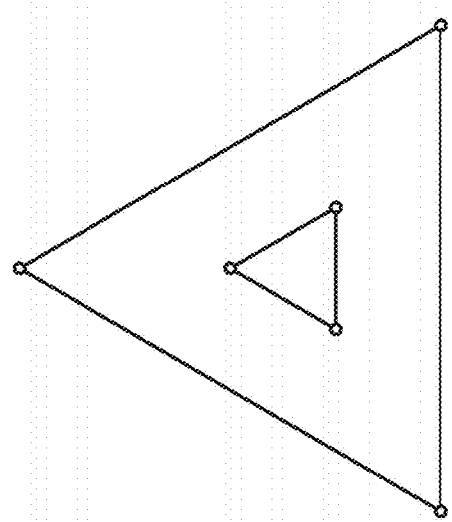
FIG. 12A is a graphic illustration showing a problem domain.
Figure 12B:
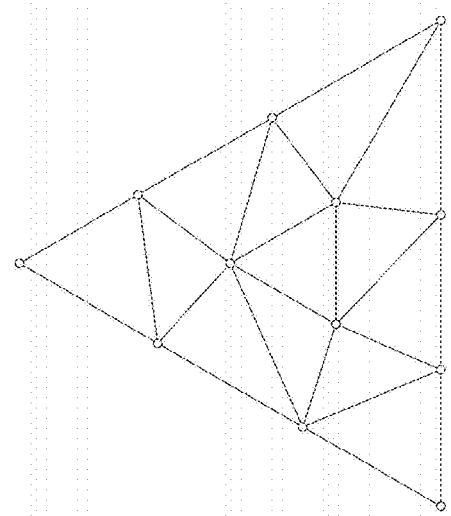
FIG. 12B is a graphic illustration showing an initial parametric mesh relative to the problem domain of FIG. 12A.
Figure 12C:
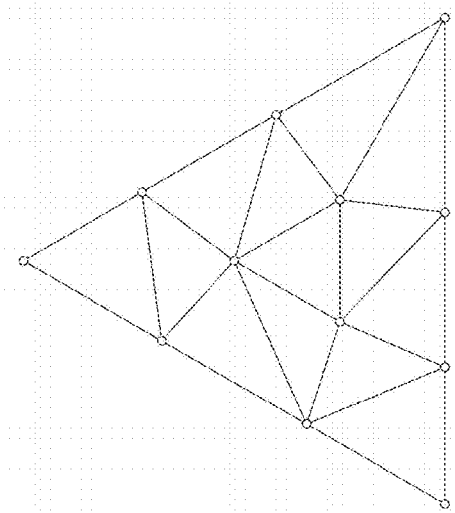
FIG. 12C is a graphic illustration showing an initial physical mesh relative to the problem domain of FIG. 12A.
Figure 12D:
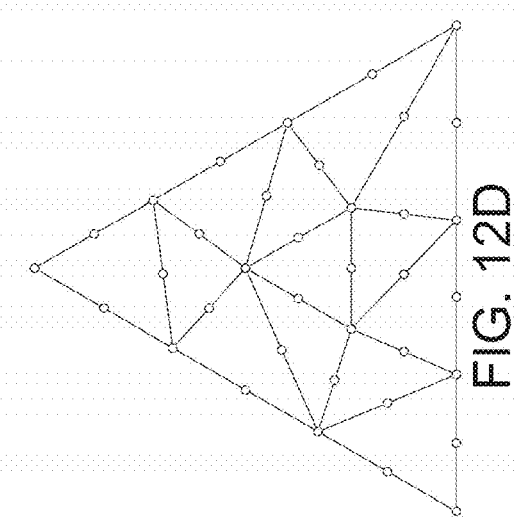
FIG. 12D is a graphic illustration showing is a quadratic mesh, $S_2^0$, relative to the problem domain of FIG. 12A.
Figure 12E:
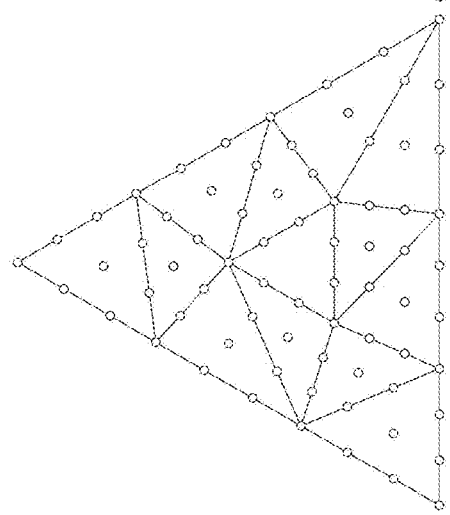
FIG. 12E is a graphic illustration showing a cubic mesh, $S_3^0$, relative to the problem domain of FIG. 12A.
Figure 12F:
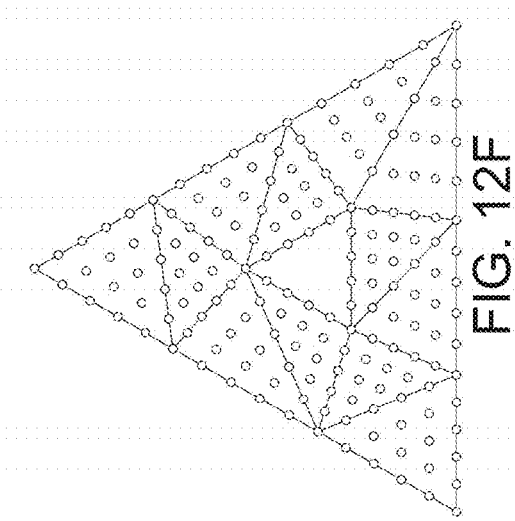
FIG. 12F is a graphic illustration showing a quintic mesh, $S_5^0$, relative to the problem domain of FIG. 12A.

Based on our parameterization strategy in described above, the parametric domain illustrated in FIG. 12A is the same as the physical domain, since the boundary edges are all straight. The initial linear mesh is obtained by the Delaunay triangulation of the problem domain, as shown in FIGS. 12B and 12C. By degree elevation, meshes corresponding to quadratic, cubic and quintic $C^0$ spline spaces are obtained, as shown in FIGS. 11C, 11D, and 11E, respectively. Only the physical meshes are shown since the parametric meshes are the same as the corresponding physical meshes.

Figures 13A, 13B:
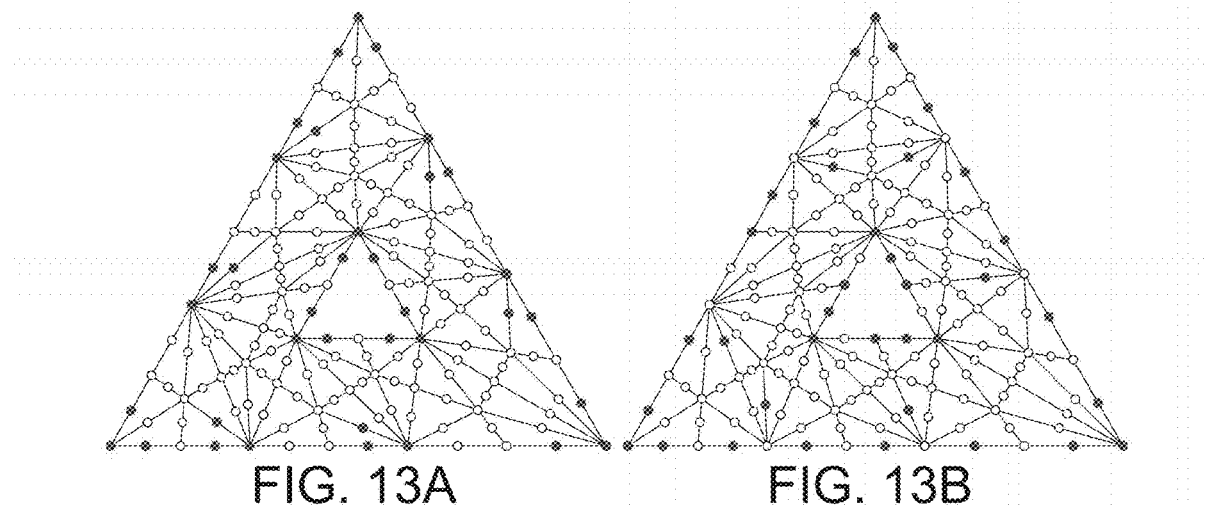
FIG. 13A is a graphic illustration showing a physical mesh relative to the problem of FIG. 12A, $S_2^1(T_{ps})$ by DC, dim=36.
FIG. 13B is a graphic illustration showing a physical mesh relative to the problem of FIG. 12A, $S_2^1(T_{ps})$ by GE, dim=36.
Figures 13C, 13D:
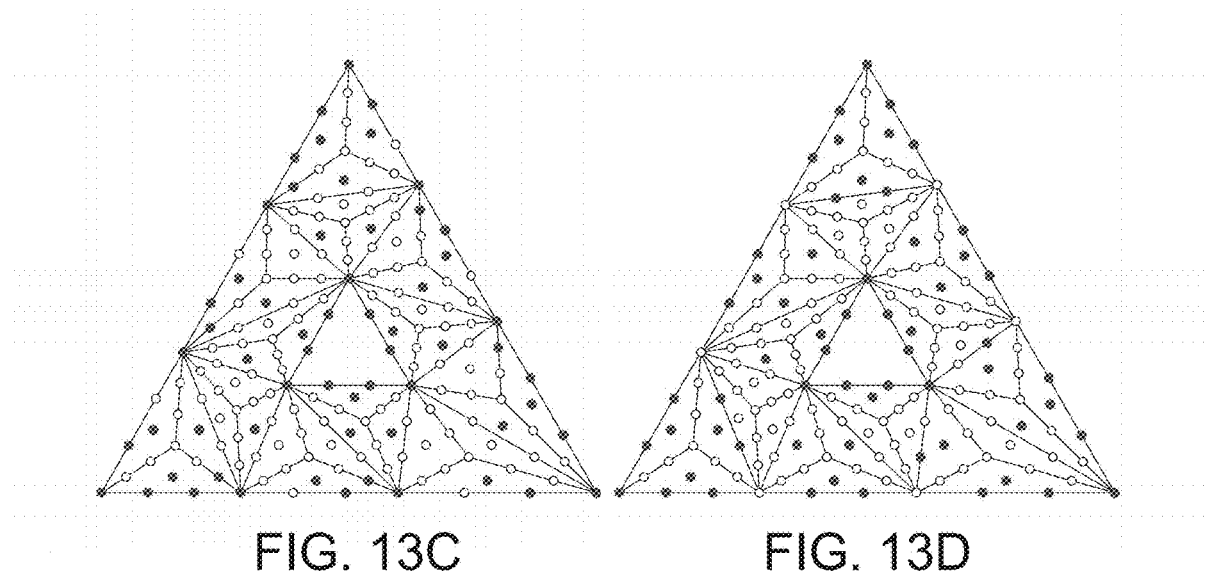
FIG. 13C is a graphic illustration showing a physical mesh relative to the problem of FIG. 12A, $S_2^1(T_{ps})$ by DC, dim=60.
FIG. 13D is a graphic illustration showing a physical mesh relative to the problem of FIG. 12A, $S_3^1(T_{ct})$ by GE, dim=60.
Figure 13E:
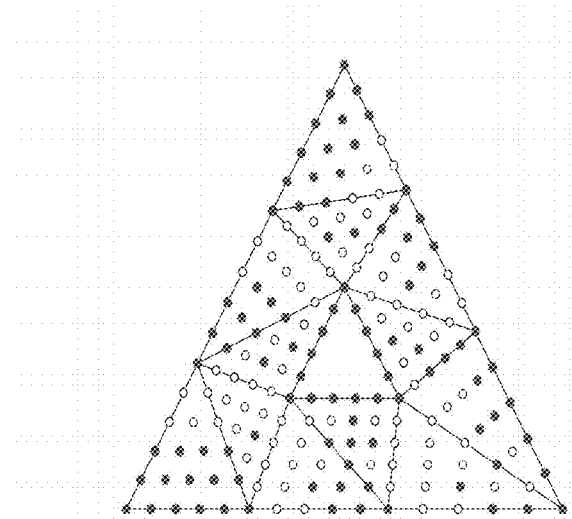
FIG. 13E is a graphic illustration showing a physical mesh relative to the problem of FIG. 12A, $S_5^{1,2}(T)$ by DC, dim=96.
Figure 13F:
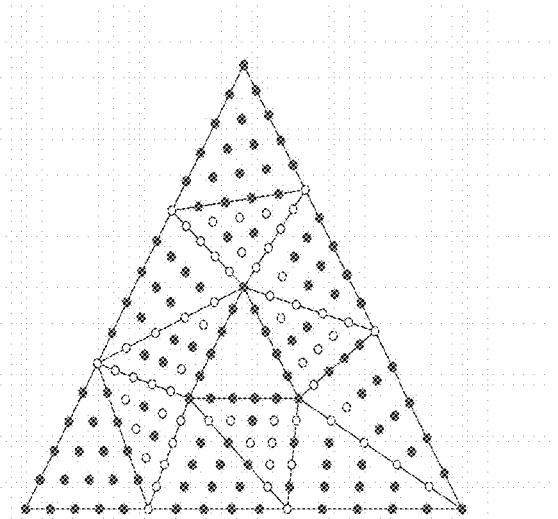
FIG. 13F is a graphic illustration showing a physical mesh relative to the problem of FIG. 12A, $S_5^1(T)$ by GE, dim=120.
Figure 13G:
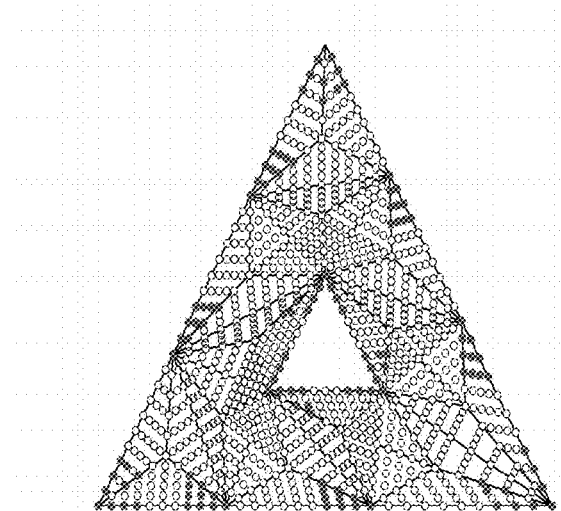
FIG. 13G is a graphic illustration showing a physical mesh relative to the problem of FIG. 12A, $S_5^{2,3}(T_{ps})$ by DC, dim=120.
Figure 13H:
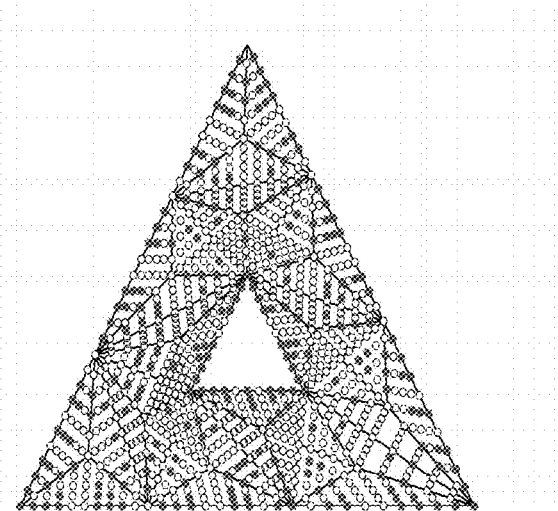
FIG. 13H is a graphic illustration showing a physical mesh relative to the problem of FIG. 12A, $S_5^2(T_{ps})$ by GE, dim=252.

Meshes corresponding to $C^r$ spaces with stable basis for analysis can be obtained through the macro-element techniques via either the DC or GE method as described above. For example, FIGS. 13A-13H show the $C^r$ mesh corresponding to $C^0$ meshes discussed above with respect to FIGS. 12A-12F, including quadratic $C^1$ PS macro-element space $S_2^1(T_{ps})$, cubic $C^1$ CT macro-element space $S_3^1(T_{ct})$, quintic $C^1$ polynomial macro-element space $S_5^1(T)$, $S_5^{1,2}(T)$ and quintic $C^2$ PS macro-element space $S_5^2(T_{ps})$ and $S_5^{2,3}(T_{ps})$. In FIGS. 13A-13H, solid dots represent free nodes and hollow dots represent dependent nodes. The dimension of each space (number of independent basis functions) is also reported. As can be seen, for $S_2^1(T_{ps})$ and $S_3^1(T_{ct})$, although the MDS obtained by DC and GE may be different, the dimension of the spaces are exactly the same, and so are the numerical solutions resulted from the two methods. For the quintic $C^1$ and $C^2$ spaces, DC yields superspline spaces which have smaller dimension than the ones obtained by GE. For example, the space $S_5^{1,2}(T)$ obtained by DC has dimension 96 (FIG. 13E) while the space $S_5^1(T)$ obtained by GE has dimension 120 (FIG. 13F), and the space $S_5^{2,3}(T_{ps})$ obtained by DC has dimension 120 (FIG. 13G) while the space $S_5^2(T_{ps})$ obtained by GE has dimension 252 (FIG. 13H).

To study the convergence, uniform refinements are performed on the initial $C^0$ meshes (FIGS. 12D-12F) before the same macro-element techniques are used to obtain stable $C^r$ basis. The refinement sequences for these spaces are $\{T_{ps}, T_{u,ps}, T_u, \ldots, u_{ps}, \ldots\}$ in $S_2^1(T_{ps})$, in $\{T_{ct}, T_{u,ct}, T_u, \ldots, u_{ct}, \ldots\}$ in $S_3^1(T_{ct})$, $\{T, T_u, T_u, \ldots, u, \ldots\}$ in $S_5^{1,2}(T)$, $\{T, T_u, T_u, \ldots, u, \ldots\}$ in $S_5^1(T_{ps})$, $\{T_{ps}, T_{u,ps}, T_u, \ldots, u_{ps}, \ldots\}$ in $S_5^{2,3}(T_{ps})$ and $\{T_{ps}, T_{u,ps}, T_u, \ldots, u_{ps}, \ldots\}$ in $S_5^2(T_{ps})$. Note, in this example, no pre-refinement smooth map was explicitly constructed. The reason for this is that, for domains bounded by straight line segments, the parametric mesh are identical to the physical mesh and the geometric map is in fact $C^\infty$ smooth.

Figure 14A:
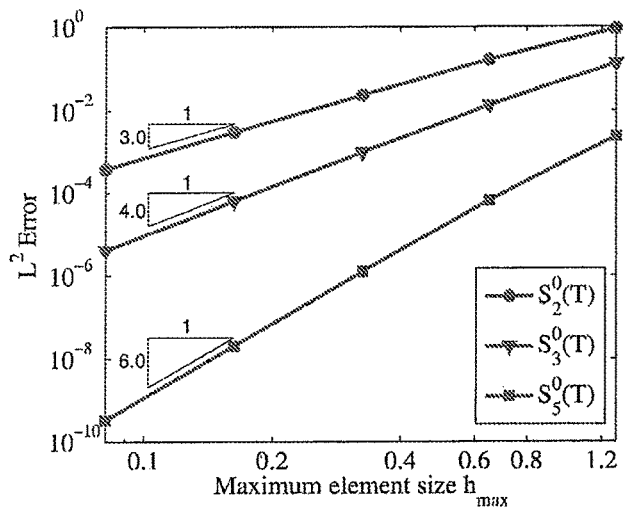
FIG. 14A is a graph showing convergence rates in $C^0$ space.
Figure 14B:
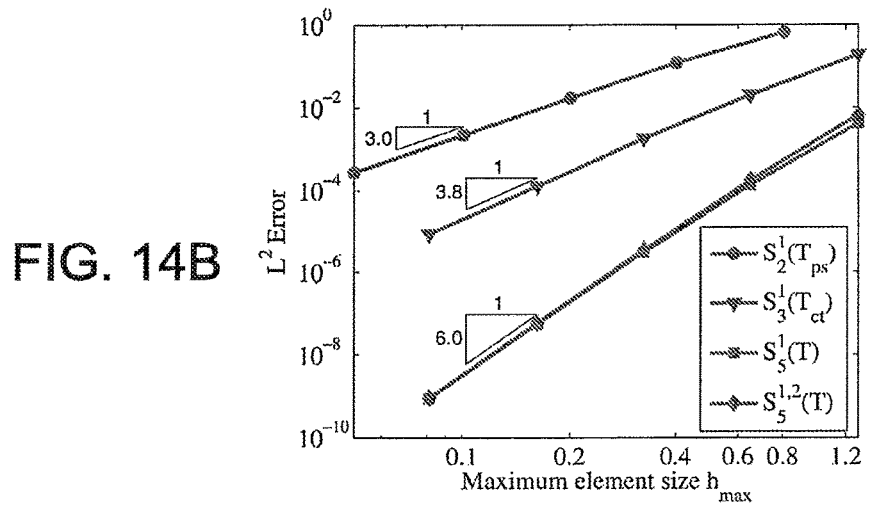
FIG. 14B is a graph showing convergence rates in $C^1$ space.
Figure 14C:
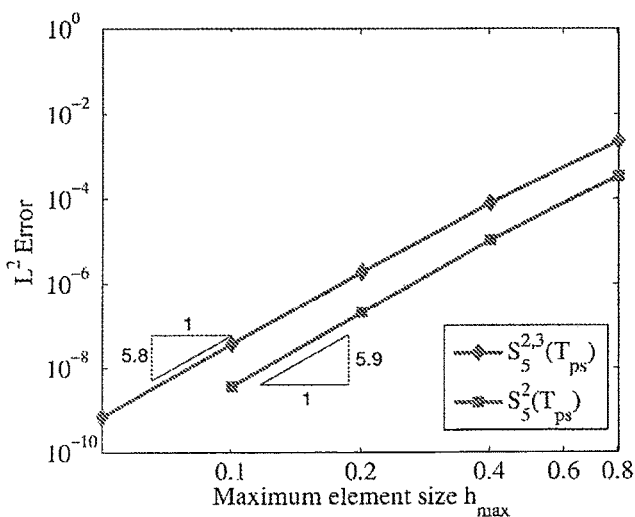
FIG. 14C is a graph showing convergence rates in $C^2$ space.

In the convergence study, we compute the analysis error by:

$$e_u = \left[\int_\Omega (u_{num} - u_{exact}) \cdot (u_{num} - u_{exact}) d\Omega\right]^{1/2}, \quad (36)$$

where $u_{num}$ and $u_{exact}$ are the numerical and exact solutions, respectively. The longest edge $h_{max}$ of the triangles in the physical mesh is considered as the mesh parameter. FIGS. 14A-14C illustrate the error measured in the $L^2$-norm versus mesh parameter. As shown in FIGS. 14A-14C, optimal convergence rates are achieved in the tested $C^0$, $C^1$ and $C^2$ spaces, including in the superspline spaces $S_5^{1,2}(T)$ in FIG. 14B and $S_5^{2,3}(T_{ps})$ in FIG. 14C. Particularly, comparing with the regular $C^r$ spline space, the same optimal convergence rate is obtained in the superspline space, but with far fewer degree of freedoms. For example, for space $S_5^2(T_{ps})$, the number of free DOFs obtained via the GE method are respectively 252, 843, 3063, and 11679, corresponding to the refinement sequences in FIG. 13C. On the other hand, for the superspline $S_5^{2,3}(T_{ps})$, the number of DOFs obtained via the DC method are respectively 120, 360, 1200, 4320 and 16320, corresponding to the refinement sequences in FIG. 13C. Note that for spaces $S_2^1(T_{ps})$ and $S_3^1(T_{ct})$, DC and GE yields exactly the same analysis results and their convergence curves overlap with each other in this figure.

The refinement steps, the methods for obtaining $C^r$ stable basis for analysis, and the convergence rates for each type of elements are summarized in Table 1. It can be seen that optimal convergence rates have been achieved with all types of $C^r$ rTBS elements.

TABLE 1 smooth-refinement-smooth steps and convergence rates of different $C^r$ spaces for the problem in FIG. 12A-12F.

| | Pre-refinement map | | | Step Refine-ment | Stable basis | | Conv. rate |
|---|---|---|---|---|---|---|---|
| Space | Smoothness | Split | Method | | Split | Method | |
| $S_2^1(T_{ps})$ | $C^\infty$ | | | uniform | PS | DC or GE | 3.0 |
| $S_3^1(T_{ct})$ | $C^\infty$ | | | uniform | CT | DC or GE | 3.8 |
| $S_5^1(T)$ | $C^\infty$ | | | uniform | | GE | 6.0 |
| $S_5^{1,2}(T)$ | $C^\infty$ | | | uniform | | DC | 6.0 |
| $S_5^2(T_{ps})$ | $C^\infty$ | | | uniform | PS | GE | 5.8 |
| $S_5^{2,3}(T_{ps})$ | $C^\infty$ | | | uniform | PS | DC | 5.9 |

Domain with Curved Boundaries: Poisson Problem

Figure 15C:
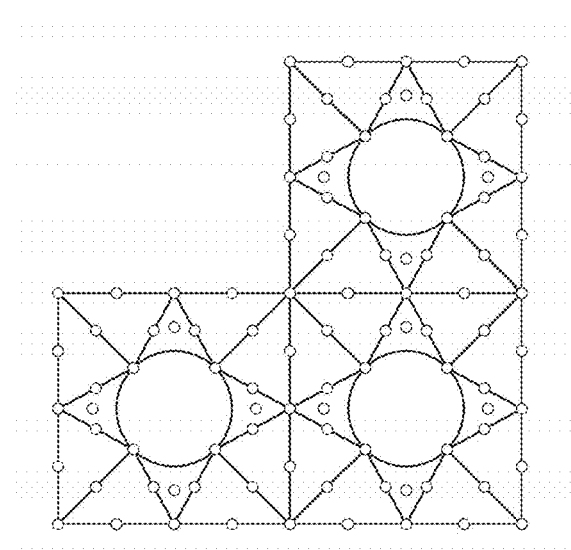
FIG. 15C is a graphic illustration of an initial quadratic physical mesh of the domain of FIG. 15A.
Figure 15B:
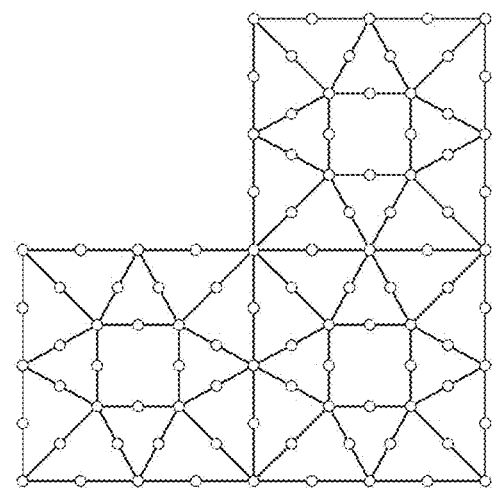
FIG. 15B is a graphic illustration of an initial quadratic parametric mesh of the domain of FIG. 15A.
Figure 15A:
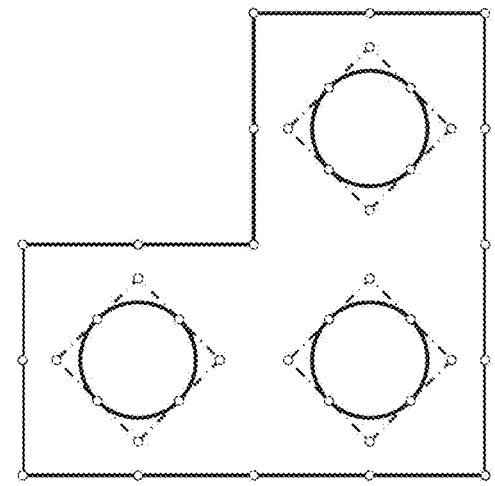
FIG. 15A is a graphic illustration of an L-shaped domain with three holes.
Figure 16A:
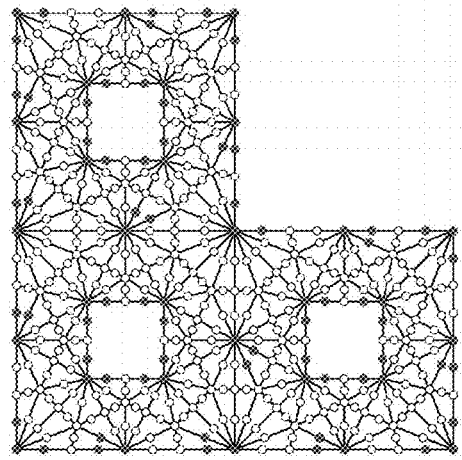
FIG. 16A is a graphic illustration showing a parametric mesh in $S_2^1(T_{ps})$ with basis obtained by DC with PS macro-elements.
Figure 16B:
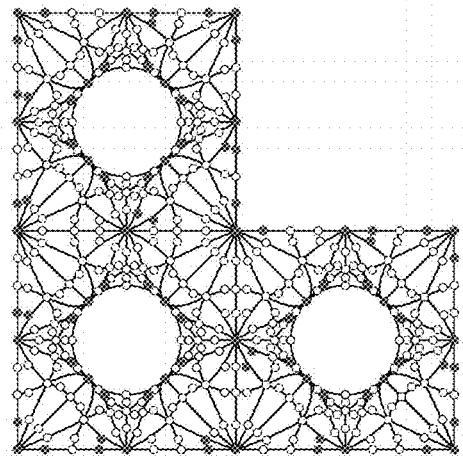
FIG. 16B is a graphic illustration showing a $C^1$ physical mesh obtained by DC with PS macro-elements.
Figure 16C:
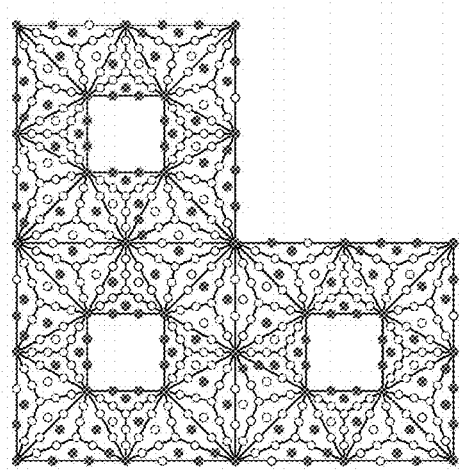
FIG. 16C is a graphic illustration showing a parametric mesh in $S_3^1(T_{ct})$ with basis obtained by DC with CT macro-elements.
Figure 16D:
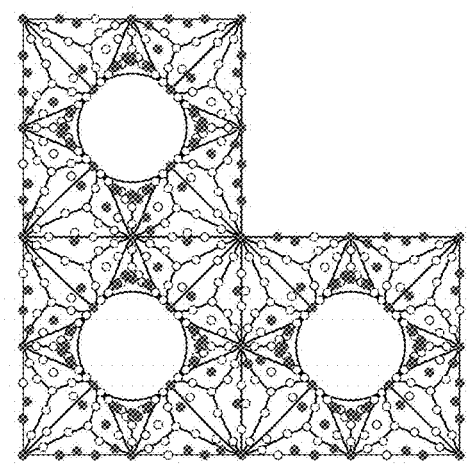
FIG. 16D is a graphic illustration showing a $C^1$ physical mesh obtained by DC with CT macro-elements.
Figure 16E:
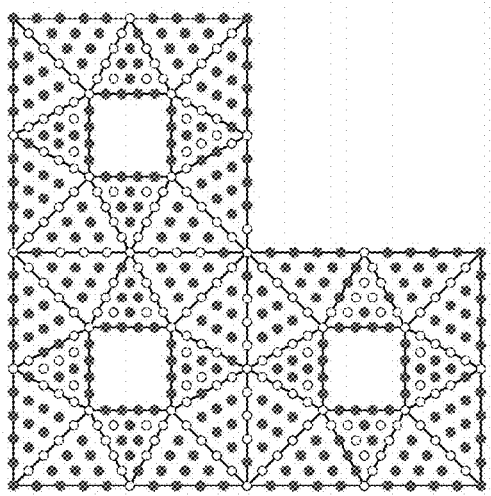
FIG. 16E is a graphic illustration showing a parametric mesh in $S_5^1(T)$ with basis obtained by GE.
Figure 16F:
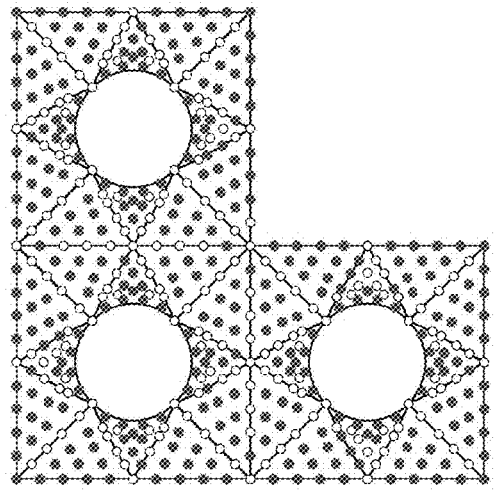
FIG. 16F is a graphic illustration showing a $C^1$ physical mesh obtained by GE.
Figure 16G:
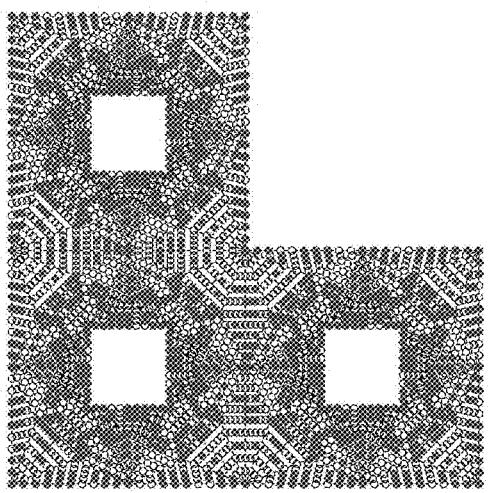
FIG. 16G is a graphic illustration showing a parametric mesh in $S_5^{1,2}(T)$ with basis obtained by DC.
Figure 16H:
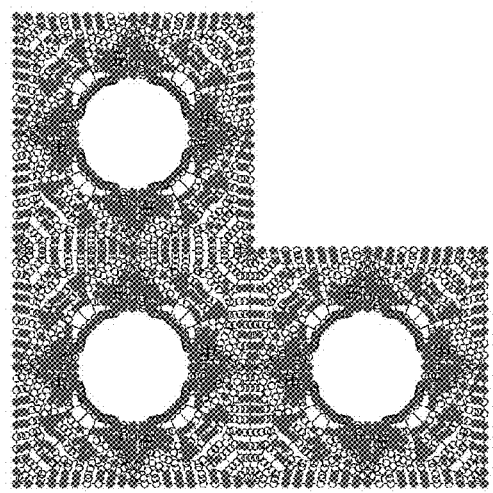
FIG. 16H is a graphic illustration showing a $C^2$ physical mesh in $S_5^{1,2}(T)$.

In this example we solve a Poisson problem on a L-shaped domain with three holes, as shown in FIG. 15A. White nodes represent the control points. The boundaries of the domain are represented in NURBS with weights so chosen that exact circular holes are represented. The governing equation is equation (22) with the open set domain being defined as:

$$\Omega := \{((x,y)|[0 \le x \le 16) \& (0 \le y \le 1.6)] \setminus [((8 < x < 16) \& (8 < y < 16)) \cup ((x-4)^2 + (y-4)^2 < 4) \cup ((x-12)^2 + (y-4)^2 < 4) \cup ((x-4)^2 + (y-12)^2 < 4)]\}. \quad (37).$$

The body force is:

$$f(x,y) = 2\sin(x)\sin(y), \quad (38);$$

and the exact solution is given by:

$$u(x,y) = \sin(x)\sin(y). \quad (39).$$

To create the initial parametric mesh, we first extract quadratic Bézier curves from the NURBS boundary curves of the physical domain. Particularly, four rational Bézier segments are exacted from each circular boundary. The end points of these Bézier curves are connected to form the initial parametric domain, which is then triangulated to obtain the initial parametric mesh, as shown in FIG. 15B. We then replace the boundary control points of the parametric mesh with corresponding points from the physical boundary to obtain the initial physical mesh, as shown in FIG. 15C. The $C^r$ stable basis for analysis can be obtained as usual by degree elevation followed by either the DC or GE method based on the macro-element techniques. For example, FIGS. 16A-16H show parametric and physical meshes for different $C^r$ spaces. In particular, the meshes correspond to quadratic $C^1$ PS macro-element space $S_2^1(T_{ps})$, cubic $C^1$ CT macro-element space $S_3^1(T_{ct})$, quintic $C^1$ polynomial macro-element space $S_5^1(T)$ and $S_5^{1,2}(T)$.

Figure 17A:
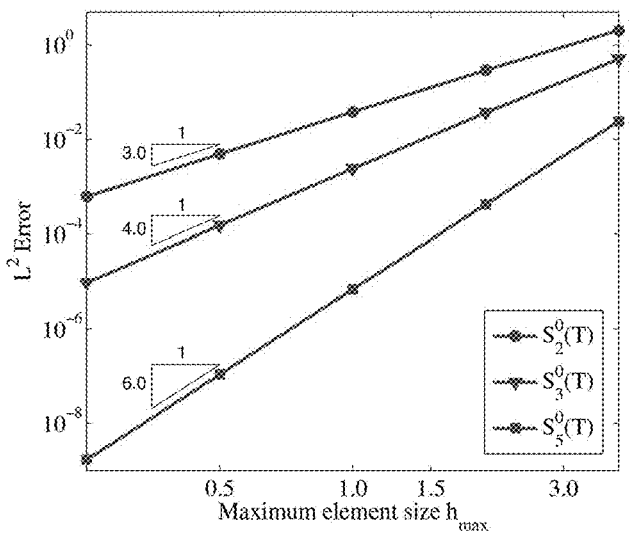
FIG. 17A is a graph showing error measured in the $L^2$-norm vs. mesh parameter from refined elements in FIGS. 16A-16H to illustrate convergence rates in $C^0$ space.
Figure 17B:
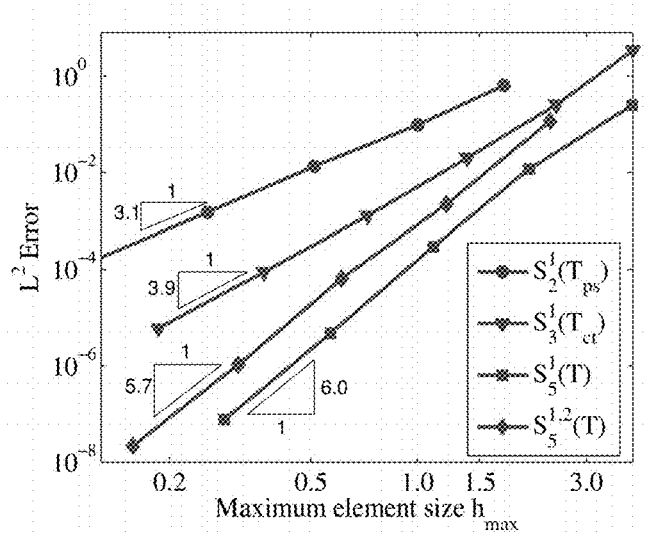
FIG. 17B is a graph showing error measured in the $L^2$-norm vs. mesh parameter from refined elements in FIGS. 16A-16H to illustrate convergence rates in $C^1$ space with nested refinement sequences.

The refinement sequences used to evaluate the convergence are $\{T_{ps}, T_{ps,u,ps}, T_{ps,u}, \ldots, _{u,ps}, \ldots\}$ in $S_2^1(T_{ps})$, $\{T_{ct}, T_{ct,u,ct}, T_{ct,u}, \ldots, _{u,ct}, \ldots\}$ in $S_3^1(T_{ct})$, $\{T, T_u, T_{u}, \ldots, _u, \ldots\}$ in $S_5^1(T)$, and $\{T_{ps}, T_{ps,u}, T_{ps,u}, \ldots, _u, \ldots\}$ in $S_5^{1,2}(T)$. The methods for constructing pre-refinement smooth maps, refinement, and methods of basis construction in each $C^r$ space are summarized in Table 2. For example, for the superspline space $S_5^{1,2}(T)$, the initial physical mesh is $C^2$ smooth obtained by GE with PS macro-elements. The four pairs of figures (i.e., FIGS. 16/16B, 16C/16D, 16E/16F, 16G/16H) correspond to the four initial pairs of parametric and physical meshes in the four convergence studies, respectively. The convergence rates obtained in $C^0$ and $C^1$ spaces are all optimal as shown in FIGS. 17A and 17B, where the convergence rates for quadratic, cubic and quintic elements are 3, 4, and 6 respectively in all $C^0$, $C^1$ and $C^{1,2}$ spaces.

Figure 17C:
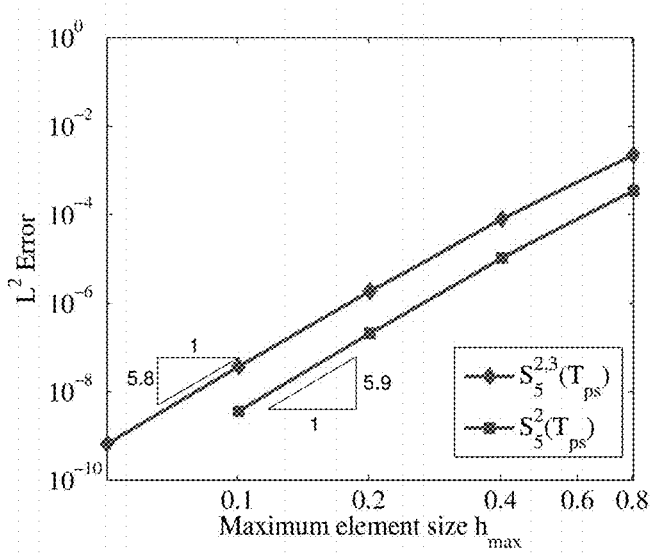
FIG. 17C is a graph showing Error measured in the $L^2$-norm vs. mesh parameter in $C^1$ spaces for refinement sequences with inconsistent geometric map, establishing that the optimal convergence rates are not achieved.

If the refine-then-smooth strategy is used and, thus, no smooth pre-refinement map is constructed, the geometric map changes and convergence rate decreases as the mesh is refined. As shown in FIG. 17C, although the rate in $S_2^1(T_{ps})$ is optimal, the rates in $S_3^1(T_{ct})$ and $S_5^1(T)$ are 3, and the rate in $S_5^{1,2}(T)$ decreases quickly to about 4.1. Note that the extreme large errors in $S_5^{1,2}(T)$ on for the coarse meshes are due to the poor mesh quality.

Domain with Curved Boundaries: Linear Elasticity

Figure 18:
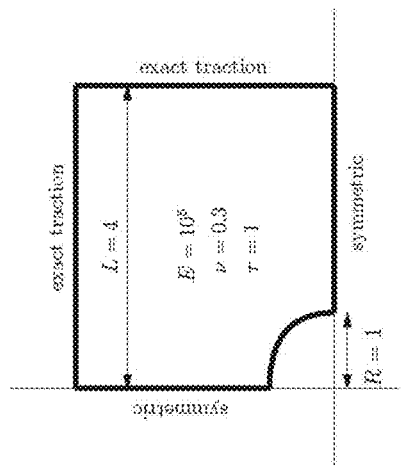
FIG. 18 is a graphic illustration of an elastic plate with a circular hole, where L is the length of the edge, R is the radius of the circle, and τ is the thickness of the plate, and where E and ν represent the Young's modulus and Poisson ratio respectively.

In the third example, we apply our approach to a well-known linear elasticity problem: an infinite plate with a circular hole under constant in-plane tension in the x-direction. The infinite plate is modeled by a finite quarter plate as shown in FIG. 18 with the governing equation (21). L is the length of the edge, R is the radius of the circle and τ is the thickness of the plate. E and ν represent the Young's modulus and Poisson ratio, respectively. The exact solution, evaluated at the boundary of the finite quarter plate, is applied as a Neumann boundary condition.

Figure 19C:
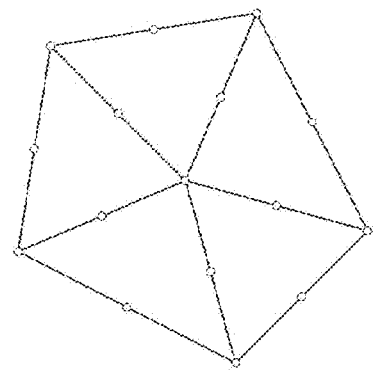
FIG. 19C is a graphic illustration of a smoothed parametric mesh of the physical domain of FIG. 18.
Figure 19B:
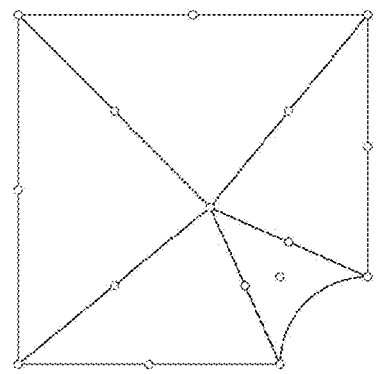
FIG. 19B is a graphic illustration of an initial physical mesh of the physical domain of FIG. 18.
Figure 19A:
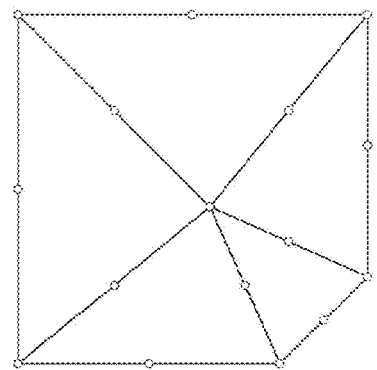
FIG. 19A is a graphic illustration of an initial parametric mesh of the physical domain of FIG. 18.

The initial parameterization of the physical domain is shown in FIGS. 19A-19C. The NURBS boundary curves of the given domain are first extracted as rational quadratic Bézier curves. After connecting the end points of the Bézier curves, we obtain an initial parametric domain and triangulate it, as shown in FIG. 19B. Then, we replace the boundary control points with corresponding points on the physical boundary to obtain the initial physical mesh as shown in FIG. 19A. To improve the mesh quality and analysis results, we use the same smoothed parametric mesh, as in FIG. 19C, by minimizing the difference of the internal corner angles between the parametric and physical domains.

Figure 20G:
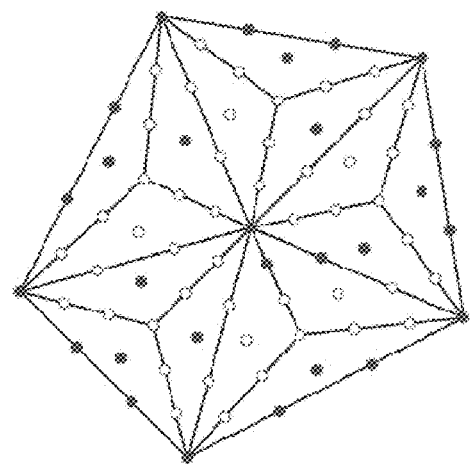
FIG. 20G is a graphic illustration of a parametric mesh in $S_3^1(T_{ct})$ with basis obtained by DC with CT macro-elements of the physical domain of FIG. 18.
Figure 20H:
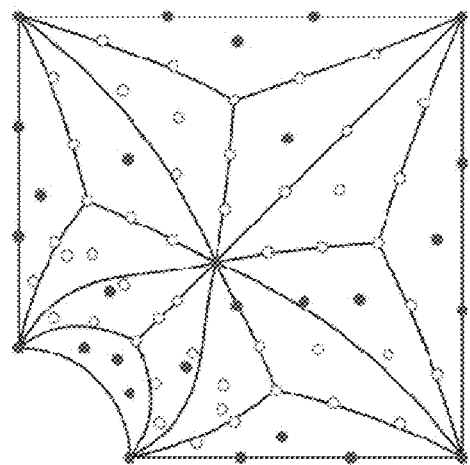
FIG. 20H is a graphic illustration of a $C^1$ physical mesh obtained by DC with CT macro-elements of the physical domain of FIG. 18.
Figure 20I:
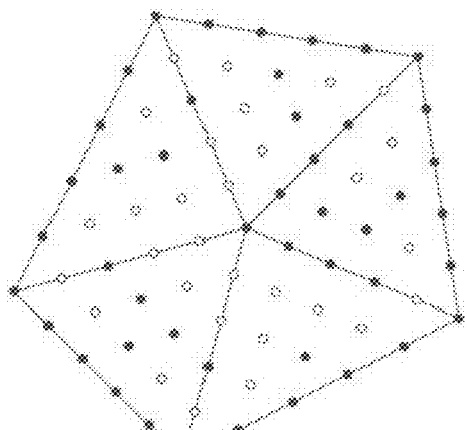
FIG. 20I is a graphic illustration of a parametric mesh $S_5^{1,2}(T)$ with basis obtained by DC of the physical domain of FIG. 18.
Figure 20J:
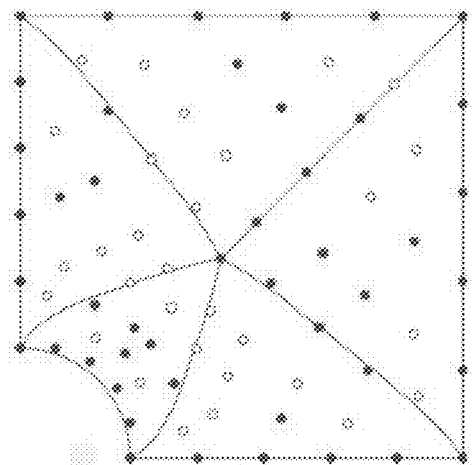
FIG. 20J is a graphic illustration of a $C^2$ physical mesh in $S_5^{1,2}(T)$ obtained by GE of the physical domain of FIG. 18.
Figure 20K:
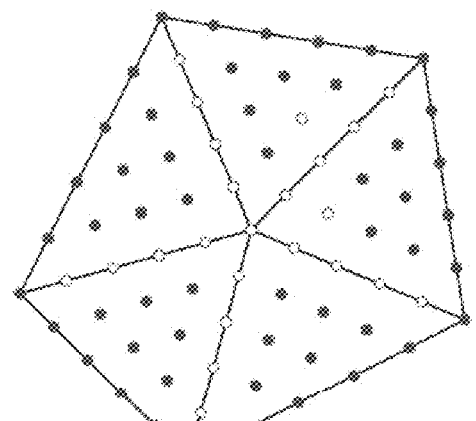
FIG. 20K is a graphic illustration of a parametric mesh in $S_5^1(T)$ with basis obtained by GE of the physical domain of FIG. 18.
Figure 20L:
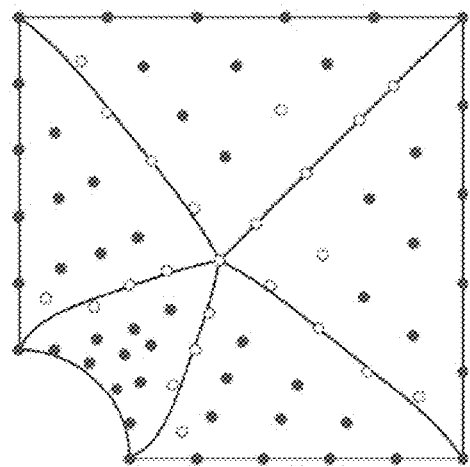
FIG. 20L is a graphic illustration of a $C^1$ physical mesh in $S_5^1(T)$ obtained by GE of the physical domain of FIG. 18.
Figure 20M:
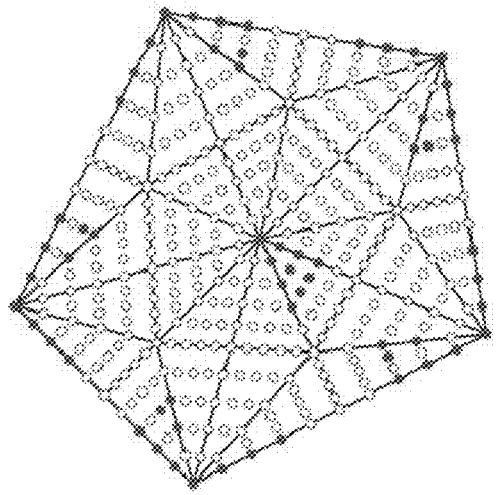
FIG. 20M is a graphic illustration of a parametric mesh in $S_5^{2,3}(T_{ps})$ with basis obtained by DC with PS macro-elements of the physical domain of FIG. 18.
Figure 20N:
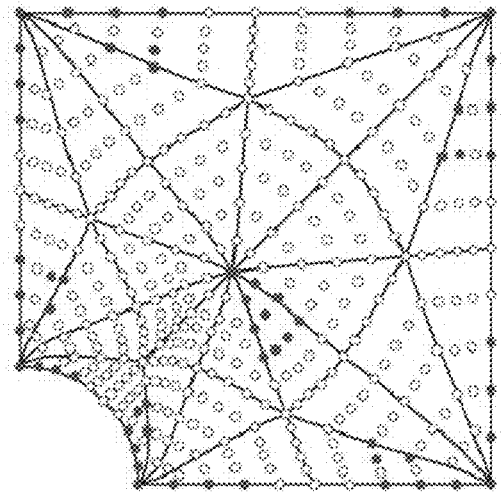
FIG. 20N is a graphic illustration of a $C^3$ physical mesh in $S_5^{2,3}(T^{ps})$ obtained by GE of the physical domain of FIG. 18.
Figure 20O:
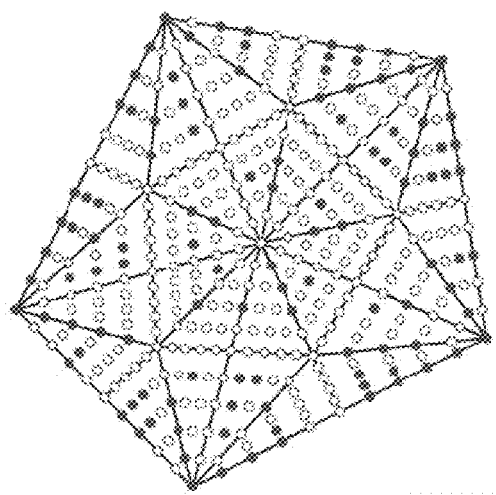
FIG. 20O is a graphic illustration of a parametric mesh in $S_5^2(T_{ps})$ with basis obtained by GE with PS macro-elements of the physical domain of FIG. 18.
Figure 20P:
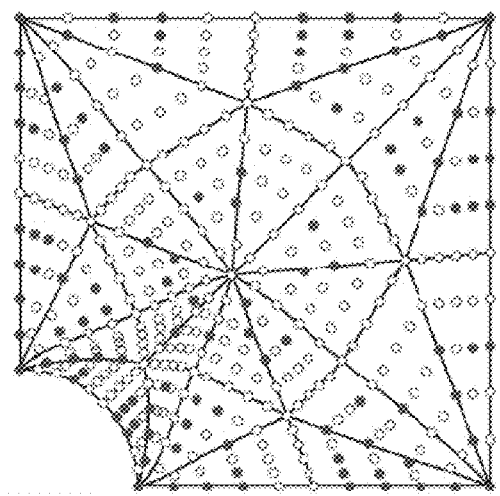
FIG. 20P is a graphic illustration of a $C^2$ physical mesh in $S_5^2(T_{ps})$ obtained by GE of the physical domain of FIG. 18.

Through degree elevation on the parametric and physical meshes in FIGS. 19A-19C, we obtain cubic and quintic $C^0$ meshes in $S_3^0(T)$ and $S_5^0(T)$, as shown in FIG. 20A-20P. Meshes in $C^r$ spaces for analysis are also obtained by either DC or GE method, as shown in FIGS. 20A-20P, where solid dots represent free nodes and hollow dots represent dependent nodes.

The refinement sequences used to evaluate the convergence are $\{T, T_u, T_u, \ldots, _u, \ldots\}$ in all $C^0$ spaces, $\{T_{ps}, T_{ps,u,ps}, T_{ps,u}, \ldots, _{u,ps}, \ldots\}$ in $S_2^1(T_{ps})$, $\{T_{ct}, T_{ct,u,ct}, T_{ct,u}, \ldots, _{u,ct}, \ldots\}$ in $S_3^1(T_{ct})$, $\{T, T_u, T_u, \ldots, _u, \ldots\}$ in $S_5^{1,2}(T)$, $\{T, T_u, T_u, \ldots, _u, \ldots\}$ in $S_5^1(T)$, $\{T_{ps}, T_{u,ps}, T_u, \ldots, _{u,ps}, \ldots\}$ in $S_5^{2,3}(T_{ps})$ and $S_5^2(T_{ps})$. The steps of convergence analysis and methods of basis construction in each $C^r$ space is summarized in Table 3. Pairs represented by FIGS. 20A/20B, 20C/20D, 20E/20F, and 20G/20H correspond to the four initial pairs of parametric and physical meshes in the four convergence studies respectively. Note that the pre-refinement smooth geometric map, $C^2$ and $C^3$ used in space $S_5^2(T_{ps})$ and $S_5^{2,3}(T_{ps})$ are both obtained by GE after imposing continuity constraints on the quintic $C^0$ mesh.

TABLE 2

Smooth-refinement-smooth steps and convergence rates of different $C^r$ spaces for the problem in FIG. 15A-C.

| | | Step | | | | | |
|---|---|---|---|---|---|---|---|
| | Pre-refinement map | | | Refine- | Stable basis | | Conv. |
| Space | Smoothness | Split | Method | ment | Split | Method | rate |
| $S_2^1(T_{ps})$ | $C^1$ | PS | DC | uniform | PS | DC | 3.1 |
| $S_3^1(T_{ct})$ | $C^1$ | CT | DC | uniform | CT | DC | 3.9 |
| $S_5^1(T)$ | $C^1$ | | GE | uniform | | GE | 6.0 |
| $S_5^{1,2}(T)$ | $C^2$ | PS | GE | uniform | | DC | 5.7 |

TABLE 3

Smooth-refinement-smooth steps and convergence rates of different $C^r$ spaces for the problem in FIG. 18.

| | | Step | | | | | |
|---|---|---|---|---|---|---|---|
| | Pre-refinement map | | | Refine- | Stable basis | | Conv. |
| Space | Smoothness | Split | Method | ment | Split | Method | rate |
| $S_2^1(T_{ps})$ | $C^1$ | PS | DC | uniform | PS | DC | 2.0 |
| $S_3^1(T_{ct})$ | $C^1$ | CT | DC | uniform | CT | DC | 2.8 |
| $S_5^1(T)$ | $C^1$ | | GE | uniform | | GE | 5.0 |
| $S_5^{1,2}(T)$ | $C^2$ | | GE | uniform | | DC | 5.0 |
| $S_5^2(T_{ps})$ | $C^2$ | | GE | uniform | PS | GE | 5.0 |
| $S_5^{2,3}(T_{ps})$ | $C^3$ | | GE | uniform | PS | DC | 4.7 |

Figure 21A:
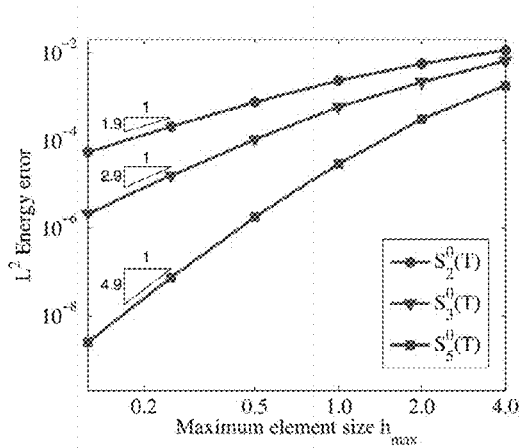
FIG. 21A is a graph showing convergence rates in $C^0$ space.
Figure 21B:
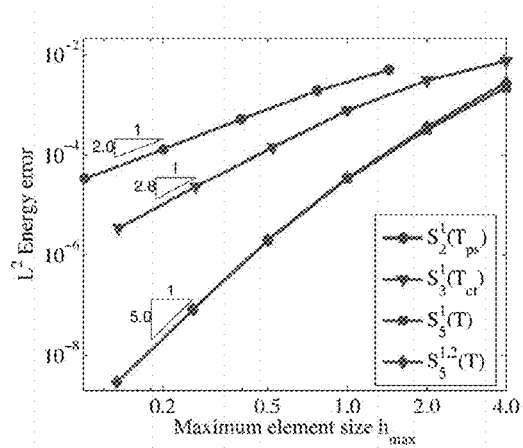
FIG. 21B is a graph showing convergence rates in $C^1$ space.
Figure 21C:
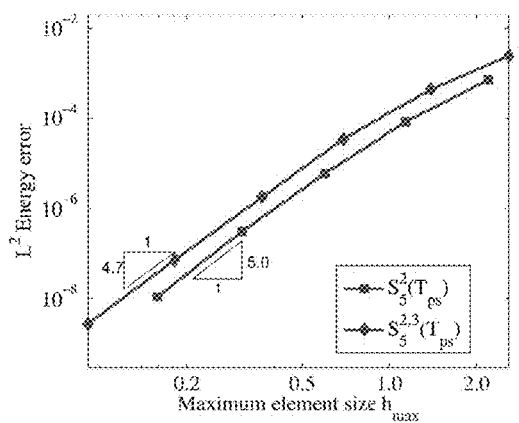
FIG. 21C is a graph showing convergence rates in $C^2$ space $S_5^2(T_{ps})$ (GE) and superspline space $S_5^{2,3}(T_{ps})$ (DC).
Figure 22:
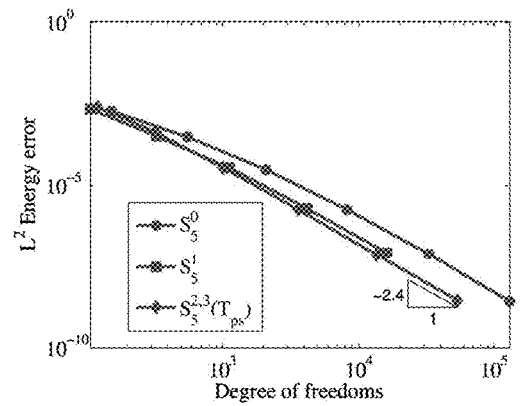
FIG. 22 is a graph showing error measured in the $L^2$-norm of stress vs. the number of nodes from refinements of three quintic elements, $S_5^0$, $S_5^1$, $S_5^{2,3}$, in FIGS. 20C/20D, FIG. 20K/20L and FIG. 20M/20N

The energy error is evaluated by:

$$e_{stress} = \left[\frac{1}{2}\int_\Omega (\varepsilon_{num} - \varepsilon_{exact}) \cdot D \cdot (\varepsilon_{num} - \varepsilon_{exact}) d\Omega\right]^{1/2}, \quad (40)$$

where $\varepsilon_{num}$ and $\varepsilon_{exact}$ are the numerical and exact strain vectors respectively. The mesh parameter is evaluated as the longest edge $h_{max}$ of the triangles in the physical mesh. Again, optimal convergence rates are achieved in $C^0$, $C^1$ and $C^2$ spaces, as shown in FIGS. 21A-21C where quadratic, cubic, and quintic rates are obtained for the energy norm error using quadratic, cubic, and quintic elements, respectively. In the superspline spaces $S_5^{1,2}(T)$ and $S_5^{2,3}(T_{ps})$, optimal rates are also observed as shown in FIGS. 21B and 21C. This demonstrates the efficiency of supersplines for analysis on a per-node basis since far fewer degree of freedoms are used in superspline space than the regular spline space of the same degree. Also, FIG. 22 provides a plot of the convergence curve on a node basis. It can be seen that at the same number of nodes in three quintic elements, $S_5^0$, $S_5^1$, $S_5^{2,3}$, higher continuity leads to smaller errors.

Figure 23:
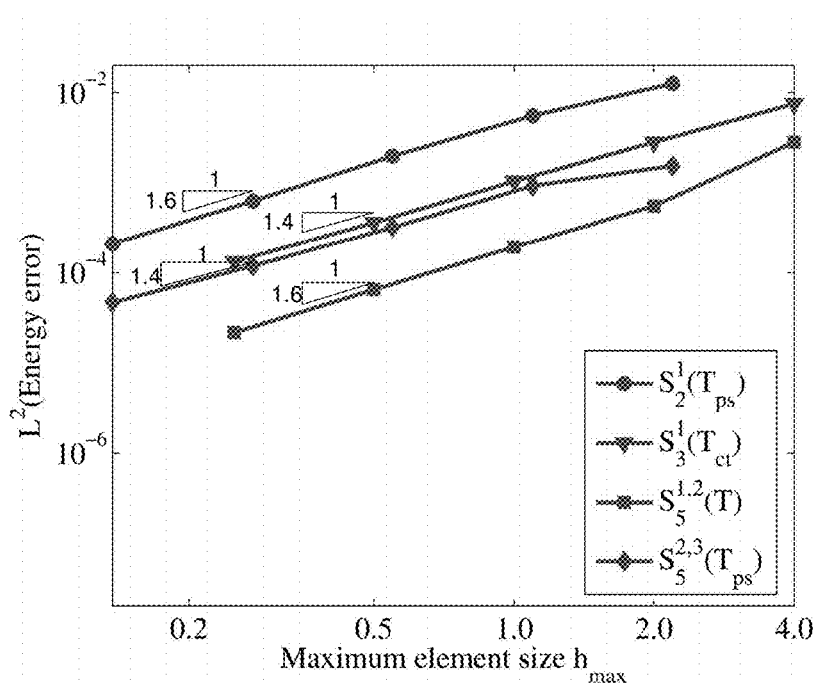
FIG. 23 is a graph showing error measured in the $L^2$-norm of stress vs. mesh parameter for refinement sequences with inconsistent geometric map, and illustrating that the convergence rates are remarkably lower than in FIGS. 21A-21C.
Figures 24A, 24B:
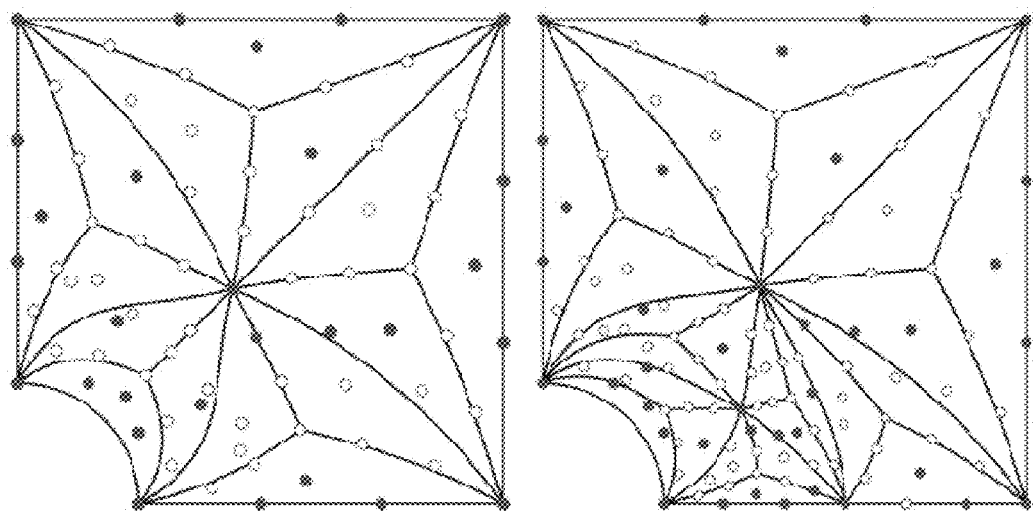
FIG. 24A is a graphic illustrating an initial $S_3^1(T_{ct})$ mesh.
FIG. 24B is a graphic illustrating a local refinement 1.
Figures 24C, 24D:
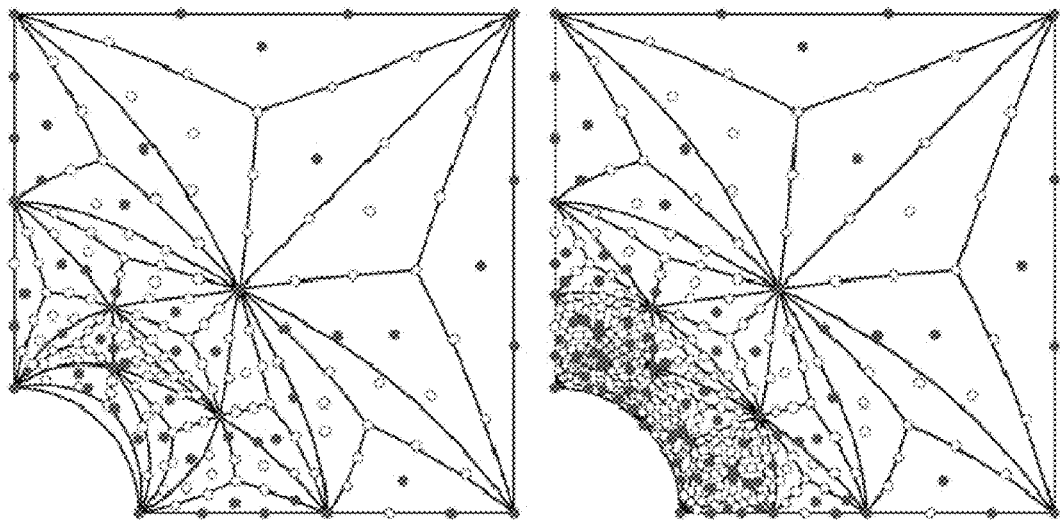
FIG. 24C is a graphic illustrating a local refinement 2.
FIG. 24D is a graphic illustrating a local refinement 3.

However, if we use the refine-then-smooth strategy, that is, without constructing the smooth pre-refinement map, the local modification of the control points to obtain the $C^r$ basis would change the geometric map. Consequently, the convergence rates are reduced, as shown in FIG. 23. The convergence rates in all $C^1$ and $C^2$ spaces with polynomial degrees ranging from quadratic to quintic are about the same, which range from 1.4 to 1.6 and are far below the optimal values.

Figure 25:
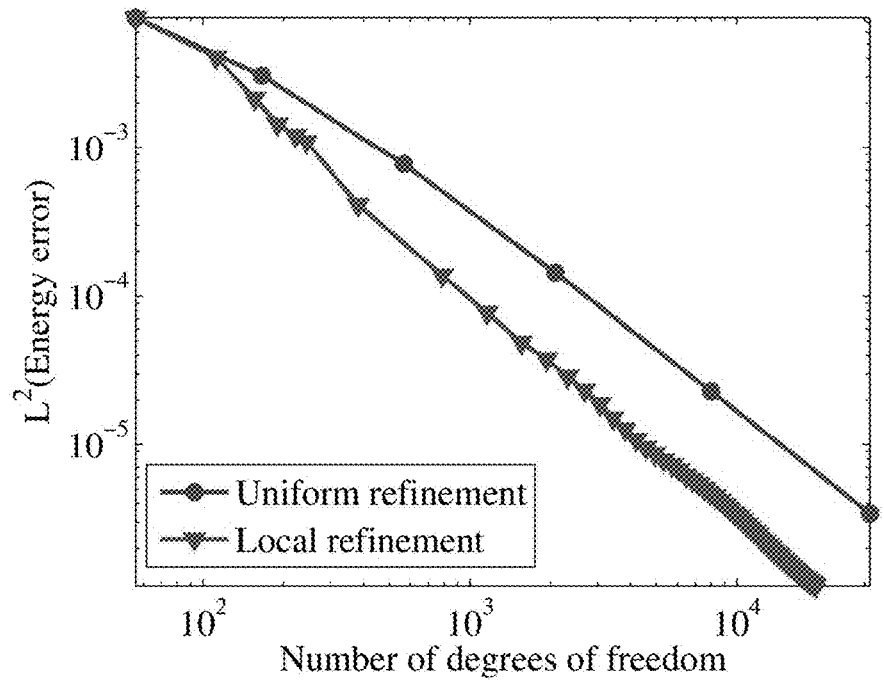
FIG. 25 is a graph showing a comparison of error per degree of freedom between uniform and local refinement in space $S_3^1(T_{ct})$ for the plate hole problem.

One advantage of using triangular meshes in analysis is the ease of local refinement of meshes. We use the Rivara method, which uses the element-wise strain energy error to guide the local refinement. The elements with large error are bisected across one of their edges. The local refinement of $S_3^1(T_{cf})$ mesh is shown in FIGS. 24A-24D. The comparison of error measured in the $L^2$-norm of stress vs. number of degree of freedoms between uniform and adaptive refinement is shown in FIG. 25. The local refinement sequence shows superior advantage with same error obtained using only one third of degree of freedoms of uniform refinement. Clearly, the local refinement exhibits superior advantage over uniform refinement by leading to the same accurate results with fewer number of degree of freedoms. Specifically, to obtain the same order of error, the uniform refinement requires about three times the number of degree of freedoms as much as the adaptive refinement.

As described above, the smooth-refine-smooth approach to rTBS based isogeometric analysis can achieve convergence rates for all $C^r$ rTBS elements. This convergence can be considered "optimal" relative to a given criteria. For example, "optimal convergence" may be defined, as described above, where equation (32) implies the rTBS space on the physical domain delivers the optimal rate of convergence, which is d+1−k in terms of the error norm in $H^k$ space for polynomials of degree d, provided that there is a set of local stable basis for $S_d^r$ and the geometric map G remains the same for different mesh size hr. Likewise, "sufficient smoothness" may be defined, for example, as the smoothness needed to maintain the consistency of the geometric map for subsequent refinements.

As described above, for a given NURBS bounded domain with arbitrary topology, the rTBS based parameterization can be fully automated, such that user intervention is not required to select or complete refinement. Various sets of globally $C^r$ continuous basis can be constructed by imposing continuity constraints on adjoining triangle elements, through either DC or GE method. Error estimates indicate that the constructed $C^r$ space delivers optimal convergence rates, provided the geometric map remains the same during refinement.

Figure 26:
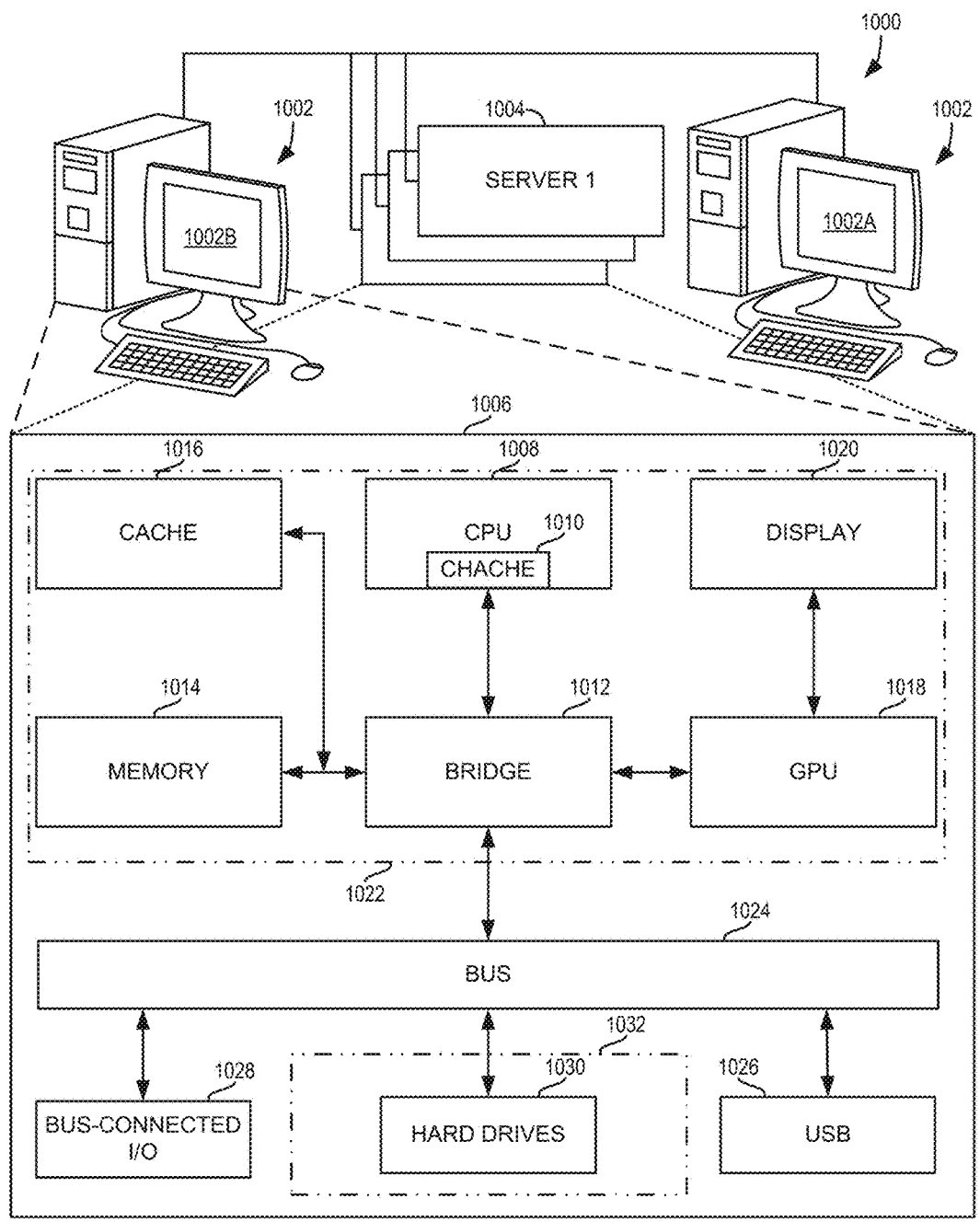
FIG. 26 is a block diagram of a non-limiting of an example of one system for implementing the systems and methods described herein.

Referring to FIG. 26, a computer network 1000 is illustrated, which may be configured to carry out a process in accordance with the present disclosure. The computer network 1000 may be formed by a plurality of workstations 1002 that are connected to one or more servers 1004. Regardless of whether the computer system is a server 1004 or workstation 1002, an underlying hardware architecture 1006 of the computer systems is illustrated. The hardware architecture 1006 may include one or more CPUs 1008, which may include one or more caches 1010. The CPU 1008 is generally connected through a bridge 1012 to memory 1014 and, in some cases, an additional non-local cache 1016. Some system may include dedicated graphics processing units (GPUs) 1018 that have been adapted from processors utilized to simply drive a display 1020 to a secondary, specialized processor that the CPU 1008 can utilize to offload tasks fitting the specialized capabilities of the CPU 1008, such as transcoding operations and many others. In any case, the general computer architecture 1006, regardless of workstation 1002 or server 1004 provides a CPU 1008 and memory 1014 and may be supplemented by secondary processing and memory components, such as a GPU 1018 and various caches 1010, 1016 dedicated to particular situations. In this regard, the above-described components may be conceptualized as a CPU/memory sub-system 1022.

The computer architecture 1006 also includes a bus or multiple buses 1024 that connect the above-described CPU/memory sub-system 1022 to other, slower components of the computer architecture 1006. For example, the buses 1024 may provide connections to a universal serial bus (USB) hub or controller 1026 and/or dedicated, bus-connected I/O devices 1028. Of course, I/O connections may vary substantially; however, in all cases, the bus 1024 provides connections to one or more hard drives 1030. These hard drives 1030 may take many forms and, more recently, include hardware advances such as solid-state drives, but are uniformly present in workstations or personal computers 1002 and servers 1004. This is because traditional notions of computer architecture can be conceptualized as, at a minimum, including a CPU/memory sub-system 1022 and a mass-storage sub-system 1032.

Figure 27:
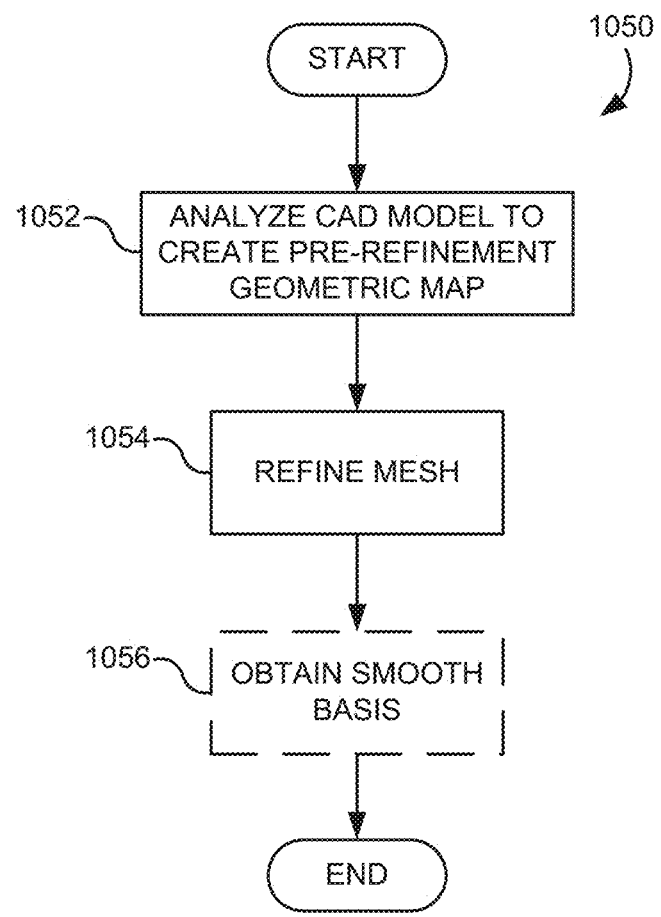
FIG. 27 is a flowchart setting forth steps of one example of a process in accordance with the present disclosure.

Thus, the above-described computer systems may be used to implement the above-described techniques. For example, referring to FIG. 27, a flowchart is provided that sets forth non-limiting, examples of steps that may be carried out, for example, using the system of FIG. 26. The process 1050 begins at process block 1052 by analyzing a CAD model to generate a pre-refinement geometric map. As described, the pre-refinement geometric map serve as a map between a parametric mesh and a physical mesh of the computer aided design model. As such, the pre-refinement geometric map is designed to have a smoothness projected to maintain a consistency of a mesh based on the pre-refinement geometric map during a refinement of the mesh. That is, the pre-refinement geometric map has smoothness projected to maintain consistency of the geometric map between the parametric mesh and the physical mesh during refinement by making the control points satisfying the continuity constraints before refinement so that they do not need to be relocated after refinement to satisfy the continuity constraints. Thus, the process begins with a "smooth" step.

At process bock 1054, the mesh is refined based on the pre-refinement geometric map to converge toward a refinement criteria associated with the CAD model. More particularly, the parametric mesh and the physical mesh are refined based on the pre-refinement geometric map to converge toward a refinement criteria associated with the CAD model. Thus, a "refine" step is performed.

At process block 1056, macro-element techniques are used to obtain stable $C^r$ smooth basis for analysis. To this end, a smooth-refine-smooth approach is provided. In the above-described smooth-refine-smooth approach, the smoothness in the pre-refinement geometric map keeps the geometric map consistent during the refinement. The smoothness in the last step is used to obtain stable $C^r$ basis for analysis.

Therefore, in order to overcome the inconsistency of geometric map during the refine-then-smooth approach, the present disclosure provides systems and methods to construct a pre-refinement map that possesses sufficient continuity for subsequent refinements. Thus, the relocation of control points is avoided and the map stays unchanged during refinement. By constructing such a pre-refinement geometric map with sufficient smoothness—convergences that meet a given threshold—have been achieved. In one example a smoothness conditions or threshold for evaluation for the pre-refinement geometric map may be one that is $C^r$ smooth for regular $C^r$ elements and $C^\rho$ smooth in cases of superspline spaces $S_d^{r,\rho}$, $\rho > r$, where super-smoothness occurs at the vertices or edges of macro-triangles.

Numerical results verified that convergence rates are improved to be optimal in different spaces with the introduction of such smooth pre-refinement maps. This demonstrates that $C^r$ rTBS elements possess superior efficiency on a per-node basis over $C^0$ elements. Such nodal efficiency is especially pronounced in the case of supersplines.

It is understood that the present invention is not limited to the specific applications and embodiments illustrated and described herein, but embraces such modified forms thereof as come within the scope of the following claims.

What is claimed is:

1. A system for creating a mesh from a computer aided design model during an isogeometric analysis process, the system comprising:
   a memory having access to a computer aided design (CAD) model of an object, wherein the geometry of the CAD model of the object is described using at least one $C^r$ smooth non-uniform Rational B-splines (NURBS) representation, where $r \geq 1$;
   a processor configured to carry out an isogeometric analysis process that includes:
      accessing the CAD model of the object from the memory;
      generating, using the NURBS representation, a pre-refinement geometric map of the CAD object that has a smoothness projected to maintain a consistency of a mesh based on the pre-refinement geometric map during a refinement of the mesh such that the pre-refinement geometric map is at least $C^r$ smooth;
      defining a plurality of elements by refining the mesh based on the pre-refinement geometric map to converge toward a refinement criteria associated with the CAD model; and
      carrying out the isogeometric analysis of the object based on at least the plurality of elements.

2. The system of claim 1 wherein the processor is further configured to further define the plurality of elements by smoothing the mesh after refining to obtain a stable $C^r$ basis for the isogeometric analysis.

3. The system of claim 2 wherein the processor is further configured to further define the plurality of elements by utilizing a macro-element technique to obtain the stable $C^r$ basis for the isogeometric analysis.

4. The system of claim 1 wherein the processor is further configured to generate the pre-refinement geometric map to serve as a map between a parametric mesh and a physical mesh of the computer aided design model.

5. The system of claim 4 wherein the processor is further configured to generate the pre-refinement geometric map to include control points corresponding to free domain points chosen as free control points.

6. The system of claim 4 wherein the processor is further configured to select the smoothness projected to maintain the consistency of the mesh by determining control points that do not need to be relocated during refinement of the mesh because the control points satisfy a continuity constraint.

7. The system of claim 6 wherein the processor is further configured to use the continuity constraint to obtain a $C^r$ basis on domain points in the parametric mesh.

8. The system of claim 6 wherein the processor is further configured to generate the pre-refinement geometric map to include dependent control points that satisfy the continuity constraint.

9. The system of claim 1 wherein the processor is further configured to select the smoothness projected to maintain the consistency of the mesh by determining control points that do not need to be relocated during refinement of the mesh because the control points satisfy a continuity constraint.

10. The system of claim 1 wherein the processor is further configured to evaluate a smoothness condition for the pre-refinement geometric map including one of determining that the pre-refinement geometric map is $C^r$ smooth for regular $C^r$ elements and $C^\rho$ smooth in cases of supersplines spaces $S_d^{r,\rho}$, $\rho > r$, where supersmoothness occurs at vertices or edges of macro-triangles.

11. A method for creating a mesh from a computer aided design model during a isogeometric analysis process, the method comprising:
   accessing to a computer aided design (CAD) model of an object, wherein the geometry of the CAD model of the object is described using a t least one $C^r$ non-uniform Rational B-splines (NURBS) representation, where $r \geq 1$;
   generating, using the NURBS representation, a pre-refinement geometric map to serve as a map between a parametric mesh and a physical mesh of the computer aided design model, wherein the pre-refinement geometric map has smoothness projected to maintain consistency of the parametric mesh or the physical mesh during refinement by determining control points that do not need to be relocated during refinement of the parametric mesh or the physical mesh because the control points satisfy a continuity constraint, wherein the pre-refinement geometric map is at least $C^r$ smooth;
   defining a plurality of elements by refining the parametric mesh or the physical mesh based on the pre-refinement geometric map to converge toward a refinement criteria associated with the CAD model; and
   carrying out the isogeometric analysis of the object based on at least the plurality of elements.

12. The method of claim 11 further comprising further defining the plurality of elements by smoothing the mesh after refining to obtain a stable $C^r$ basis for the isogeometric analysis.

13. The method of claim 12 further comprising further defining the plurality of elements by utilizing a macro-element technique to obtain the stable $C^r$ basis for the isogeometric analysis.

14. The method of claim 12 further comprising generating the pre-refinement geometric map to include control points corresponding to free domain points chosen as free control points.

15. The method of claim 11 further comprising using the continuity constraint to obtain a $C^r$ basis on domain points in the parametric mesh.

16. The method of claim 11 further comprising evaluating an optimal criteria for convergence.

17. The method of claim 16 wherein the optimal criteria includes evaluating rational triangular Bézier splines (rTBS) space on a physical domain to deliver an objective rate of convergence.

18. The method of claim 11 wherein the isogeometric analysis process is performed automatically by a computer system.

19. The method of claim 10, wherein generating the pre-refinement geometric map comprises:
   subdividing each of a plurality of NURBS curves along a boundary of the object from the NURBS representation into a set of Bézier curves via knot insertion;
   connecting end points of the Bézier curves to form a polygonal parametric domain; and
   triangulating the polygonal parametric domain.

* * * * *

UNITED STATES PATENT AND TRADEMARK OFFICE
CERTIFICATE OF CORRECTION

PATENT NO. : 10,346,554 B2
APPLICATION NO. : 14/658360
DATED : July 9, 2019
INVENTOR(S) : Xiaoping Qian et al.

It is certified that error appears in the above-identified patent and that said Letters Patent is hereby corrected as shown below:

In the Specification

Column 14, Line 24, Eq. (28),

"$K_r = \int_\Omega \nabla\Omega \cdot \nabla\psi d\Omega = \int_\Omega (CV\nabla\phi) \cdot (CV\nabla\phi)d\Omega = C^T \tilde{K}_0 C$,"
should be "$K_r = \int_\Omega \nabla\psi \cdot \nabla\psi d\Omega = \int_\Omega (CV\nabla\phi) \cdot (CV\nabla\phi)d\Omega = C^T \tilde{K}_0 C$,--.

Signed and Sealed this
Tenth Day of September, 2019

Andrei Iancu
*Director of the United States Patent and Trademark Office*